United States Patent
Ito et al.

[11] Patent Number: 5,853,079
[45] Date of Patent: Dec. 29, 1998

[54] CHIP FEED APPARATUS AND CHIP FEED CASING THEREFOR

[75] Inventors: Tsuyoshi Ito; Tetsuro Ito; Masayoshi Kobayashi, all of Yuri-gun, Japan

[73] Assignee: TDK Corporation, Japan

[21] Appl. No.: 599,048

[22] Filed: Feb. 9, 1996

[30] Foreign Application Priority Data

Nov. 24, 1994 [JP] Japan .................................. 6-312383
Mar. 30, 1995 [JP] Japan .................................. 7-095842

[51] Int. Cl.[6] .................................................. B65G 47/14
[52] U.S. Cl. ......................... 198/395; 198/400; 206/701
[58] Field of Search .................................. 198/443, 444, 198/395, 396, 400; 414/415, 414; 221/174, 154, 186, 285, 306; 206/701; 220/345

[56] References Cited

U.S. PATENT DOCUMENTS

| | | | |
|---|---|---|---|
| 1,857,815 | 5/1932 | Lafferty | 198/396 |
| 2,652,139 | 9/1953 | Baehr et al. | 198/400 |
| 2,771,191 | 11/1956 | Kath | 198/400 X |
| 3,447,662 | 6/1969 | House | 198/395 |
| 4,777,907 | 10/1988 | Sänger | 198/400 X |
| 4,846,345 | 7/1989 | Hamuro et al. | 206/328 |
| 4,889,229 | 12/1989 | Yamamoto et al. | 206/328 |
| 5,236,078 | 8/1993 | Gross et al. | 198/395 |
| 5,255,775 | 10/1993 | Buehren et al. | 198/395 |

FOREIGN PATENT DOCUMENTS

| | | |
|---|---|---|
| 59-56173 | 3/1984 | Japan . |
| 1-183200 | 7/1989 | Japan . |
| 5-193725 | 8/1993 | Japan . |
| 6-112298 | 4/1994 | Japan . |
| 7-176893 | 7/1995 | Japan . |
| 2244481 | 12/1991 | United Kingdom . |
| 2244482 | 12/1991 | United Kingdom . |

Primary Examiner—David A. Bucci
Attorney, Agent, or Firm—Lerner, David, Littenberg, Krumholz & Mentlik

[57] ABSTRACT

A chip feed apparatus capable of permitting a chip feed casing to be used for storage and transportation of chips in a distribution channel as well and preventing a weight of chips from being applied to a chip storage space of a hopper, resulting in positive separation and feeding of chips by the hopper. The chip feed apparatus includes a chip feed casing formed on a side surface thereof with a chip outlet, a hopper formed on a side surface thereof with a chip inlet and connected to the chip feed casing while enabling vertical movement of the hopper, a chip separating and aligning pipe inserted into a hole communicating with the chip storage space, and a chip feed path of which one end communicates with the chip separating and aligning pipe and the other end is defined at a chip pick-up position. The chip outlet of the chip feed casing is open at a lowermost end of a chip receiving space or below the lowermost end. The side surface of the chip feed casing and the side surface of the hopper are connected to each other while the chip outlet and chip inlet are kept aligned with each other.

23 Claims, 14 Drawing Sheets

CHIP FEED APPARATUS AND CHIP FEED CASING THEREFOR

BACKGROUND OF THE INVENTION

This invention relates to a chip feed apparatus for a chip mounting apparatus for mounting chip-type components on a printed board, and more, particularly to a chip feed apparatus for separation, alignment and feeding of bulk chip-type components and a chip feed casing therefor.

A structure which is so constructed that a chip receiving cassette is provided therein with a chip receiving space for receiving bulk chip-type components (hereinafter referred to as "chips") and an alignment passage communicating with the receiving space is disclosed in U.S. Pat. No. 4,889,229. The alignment passage is adapted to align the bulk chips with each other, which are then discharged therefrom. A basic concept of such a conventional structure is in that the chip receiving cassette and alignment passage are arranged while being kept inclined with respect to a chip feed apparatus. The structure is adapted to permit chips to naturally drop from a lower portion of the cassette to the alignment passage. Unfortunately, it causes a so-called bridge phenomenon to occur at an upper portion of the cassette, leading to a failure in dropping of chips to the alignment passage. The bridge phenomenon means that chips become entangled with each other to form a bridge of the chips in the cassette, to thereby cause the cassette to be clogged with chips through the bridge. In order to avoid the problem, it would be considered to vertically arrange the cassette while keeping it erected. However, this fails to eliminate such clogging as described above.

Also, the conventional structure described above substantially fails to be suitably applied to a chip feed apparatus including a hopper vertically arranged, because it employs the basic concept that the cassette and alignment passage are inclinedly arranged, as described above. Thus, natural dropping of chips while employing such inclined arrangement of the cassette and alignment passage tends to cause clogging of the cassette with chips due to bridge formation described above. Recently, it has been demanded to increase a chip receiving capacity of the cassette. In order to satisfy the demand, it would be considered to increase a size of the cassette. Unfortunately, this causes inclined arrangement of the cassette to be substantially unstable and leads to a disadvantageous increase in space for the arrangement.

Another conventional chip feed apparatus is proposed, which is constructed in such a manner that a hopper having bulk chips received therein is vertically mounted on the chip feed apparatus, resulting in chips being dropped one by one from a center of a lower portion of the hopper. The chip feed apparatus proposed is disclosed in Japanese Patent Application Laid-open Publication No. 183200/1989 and Japanese Patent Application Laid-open Publication No. 176893/1995 each assigned to the assignee. In the chip feed apparatus disclosed, the hopper for feeding chips is detachably connected to the apparatus and includes a combination of a structure of inserting a chip discharge pipe into the lower portion of the hopper and a structure of smoothly dropping bulk chips received in the hopper into the pipe.

In the proposed chip feed apparatus, the hopper detachably mounted on the apparatus may be vertically arranged. However, the above-described structure employed in the hopper for smoothly dropping bulk chips received in the hopper into the pipe is somewhat complicated in construction. Thus, use of the hopper in a distribution channel or system while receiving chips therein leads to an increase in cost.

Thus, it is highly desired to provide a casing which can be placed in a distribution system while receiving and storing chips therein. In view of the such a demand, a structure wherein a hopper base for feeding chips while separating them from each other and a chip feed casing adapted to be placed in a distribution system are detachably connected to each other is proposed in Japanese Patent Application No. 304411/1994. In the structure proposed, the hopper base is provided therein with a funnel-like space for receiving chips therein. The hopper base is formed at a lower portion thereof with a hole so as to communicate with the funnel-like space. Also, the structure proposed includes a chip separating member provided with a through-hole or groove, which is formed into a sectional configuration sufficient to permit one chip to pass through the through-hole. In the structure thus constructed, when a suitable number of chips are received in the hopper base, chips can be smoothly dropped from the hopper base by inserting the chip separating member into the hole of the hopper base. Unfortunately, when the casing is large-sized in order to meet the requirement for an increase in chip receiving capacity of the casing, load due to an increase in weight of chips in the casing is concentratedly applied to the hole of the hopper base, to thereby interfere with smooth separation and feeding of chips in the hopper base.

Further, the above-described conventional chip feed apparatus disclosed in Japanese Patent Application Laid-open Publication No. 176893/1995 exhibits a function of aligning bulk rectangular-parallelepipedic chips (hereinafter referred to as "rectangular chips"). However, when it is required to feed bulk rectangular chips while aligning the chips with each other based on a surface of the chips or a polarity thereof, the apparatus fails to discriminate or identify the surface or polarity. Thus, the apparatus is subject to restriction on applications thereof.

An apparatus for separating and aligning chips while discriminating a surface of the chips is disclosed in Japanese Patent Application Laid-Open Publication No. 193725/1993, which is so constructed that when a sensor arranged in proximity to an inlet of an alignment path discriminates a surface of chips, air ejected through an air ejection hole causes any one of chips to be returned to a diffusion chamber. Unfortunately, such returning of a chip by ejected air leads to damage to the chip. Also, the apparatus fails to satisfactorily align chips with each other based on a surface of chips.

SUMMARY OF THE INVENTION

The present invention has been made in view of the foregoing disadvantages of the prior art.

Accordingly, it is an object of the present invention to provide a chip feed apparatus which is capable of permitting a hopper to positively accomplish separation and feeding of chips.

It is another object of the present invention to provide a chip feed apparatus which is capable of permitting a chip feed casing to be satisfactorily large-sized.

It is a further object of the present invention to provide a chip feed apparatus which is capable of permitting a chip feed casing to be used for storage and transportation of chips in a distribution system or channel as well while ensuring simplification in structure of the casing and rendering it replaceable.

It is still another object of the present invention to provide a chip feed apparatus which is capable of effectively feeding bulk chips while aligning the chips with each other based on a surface of the chips or a polarity thereof.

It is yet another object of the present invention to provide a chip feed apparatus which is capable of positively accomplishing separation of chips from each other, chip direction shifting for aligning the chips with each other based on a surface of the chips or a polarity thereof, and feeding of the chips after the chip direction shifting.

It is a still further object of the present invention to provide a chip feed casing which is capable of being detachably mounted on a hopper exhibiting a function of separating chips from each other and dropping them one by one.

It is a yet further object of the present invention to provide a chip feed casing which is capable of being used for storage and transportation of chips in a distribution system as well as for feeding of chips to a chip feed apparatus.

In accordance with one aspect of the present invention, a chip feed apparatus is provided. The chip feed apparatus includes a chip feed casing provided therein with a chip receiving space for receiving chips therein and having a chip outlet formed on one side surface thereof so as to be open at a lowermost end of the chip receiving space or below the lowermost end and a hopper provided therein with a chip storage space and having a chip inlet formed on one side surface thereof so as to communicate with the chip storage space. The one side surface of the chip feed casing and the one side surface of the hopper are connected to each other while keeping the chip outlet and chip inlet aligned with each other, to thereby connect the chip feed casing and hopper to each other while enabling vertical movement of the hopper. The hopper is formed with a hole communicating with the chip storage space. The chip feed apparatus also includes a chip separating member inserted into the hole of the hopper and formed with a passage of a sectional configuration which permits one chip to pass through the passage and an alignment chute provided with a chip feed path of which one end is connected to the passage of the chip separating member and the other end is defined at a chip pick-up position. A height of chips stored in the chip storage space due to feeding of chips from the chip receiving space to the chip storage space is regulated by a lower one of an upper edge of the chip outlet and an upper edge of the chip inlet.

In a preferred embodiment of the present invention, the chip feed casing is separate from the hopper and detachably connected to the hopper. The chip feed casing includes a casing shutter for selectively closing the chip outlet and is prevented from being detached from the hopper when the casing shutter keeps the chip outlet open.

In a preferred embodiment of the present invention, the chip feed apparatus further includes a holding means for holding the chip feed casing on the hopper. The holding means includes holes formed on the one side surface of the chip feed casing and holding pawls projectedly formed on the one side surface of the hopper so as to be engaged with the holes. The holes and pawls are prevented from being released from engagement therebetween when the casing shutter keeps the chip outlet open.

In a preferred embodiment of the present invention, the chip feed casing and hopper are commonly provided with a first positioning means for positioning a bottom surface of the chip feed casing in a longitudinal direction thereof and a second positioning means for positioning the bottom surface of the chip feed casing in a lateral direction thereof.

In a preferred embodiment of the present invention, the chip feed apparatus further includes a sensor arranged in the chip feed path for detecting one of a surface of chips and a polarity thereof. Also, the chip feed apparatus includes a direction shifting mechanism arranged in the chip feed path for aligning chips with each other in the chip feed path in response to results of detection by the sensor so that the chips take the same posture.

In a preferred embodiment of the present invention, the chip feed path includes a vertical passage connected to the passage of the chip separating member and a horizontal chip feed path. The sensor is arranged at a portion of the vertical passage of the chip feed path. The direction shifting mechanism includes a stationary section provided with a horizontal stationary passage, a rotary section fitted on the stationary section while being kept in contact with an outside of the stationary section and a rotation drive section for driving the rotary section. The rotary section is provided with a pair of slits in a diametrically symmetrical manner, wherein the slits are each formed with a size sufficient to permit one chip to be received in the slit. The horizontal chip feed path communicates with the slits when the horizontal stationary passage of the stationary section is aligned with the slits. The slits of the rotary section receive chips dropping through the vertical passage one by one therein. The rotary section is rotated in a direction controlled in response to results of detection by the sensor, resulting in the slits communicating with the horizontal chip feed path.

In a preferred embodiment of the present invention, the chip feed apparatus further includes an air path arranged opposite to the horizontal chip feed path with the stationary section and rotary section being interposed therebetween and communicating with one of the slits when the horizontal stationary passage and the slits communicate with each other. The air path guides ejected air therethrough which acts to forcibly feed a chip received in the slit to the horizontal chip feed path.

In a preferred embodiment of the present invention, the horizontal chip feed path is provided at a distal portion thereof positionally corresponding to the chip pick-up position with a chip outlet opening which is selectively closed by a shutter. The apparatus further includes an air suction path arranged so as to communicate with the horizontal chip feed path so that air suction from the horizontal chip feed path is carried out when the shutter is operated to close the chip outlet opening and the air suction path is interrupted when the shutter is operated to open the chip outlet opening.

In a preferred embodiment of the present invention, the chip feed apparatus further includes a chip passage detection sensor arranged in the middle of the horizontal chip feed path, so that when the chip passage detection sensor detects discharge of a chip from the direction shifting mechanism, the next chip is received in the direction shifting mechanism.

In accordance with another aspect of the present invention, a chip feed casing is provided. The chip feed casing includes a casing body provided therein with a chip receiving space and formed at an upper portion with a chip inlet. The casing body is provided on one side surface thereof acting as a connected surface with a chip outlet of which an opening is positioned at a lowermost end of the chip receiving space or below the lowermost end. The chip receiving space has a bottom surface downwardly inclined toward the chip outlet. The chip feed casing also includes a casing shutter arranged so as to selectively close the chip outlet and a lid arranged on the casing body and operated so as to selectively close the chip inlet.

In a preferred embodiment of the present invention, the casing body is provided on an inner surface thereof with an overhang portion so as to be positioned above the chip outlet.

In a preferred embodiment of the present invention, the bottom surface is inclined at a portion thereof in proximity to the chip outlet at an angle of 20 to 45 degrees.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, the present invention will be described hereinafter with reference to the accompanying drawings.

Figure 1:
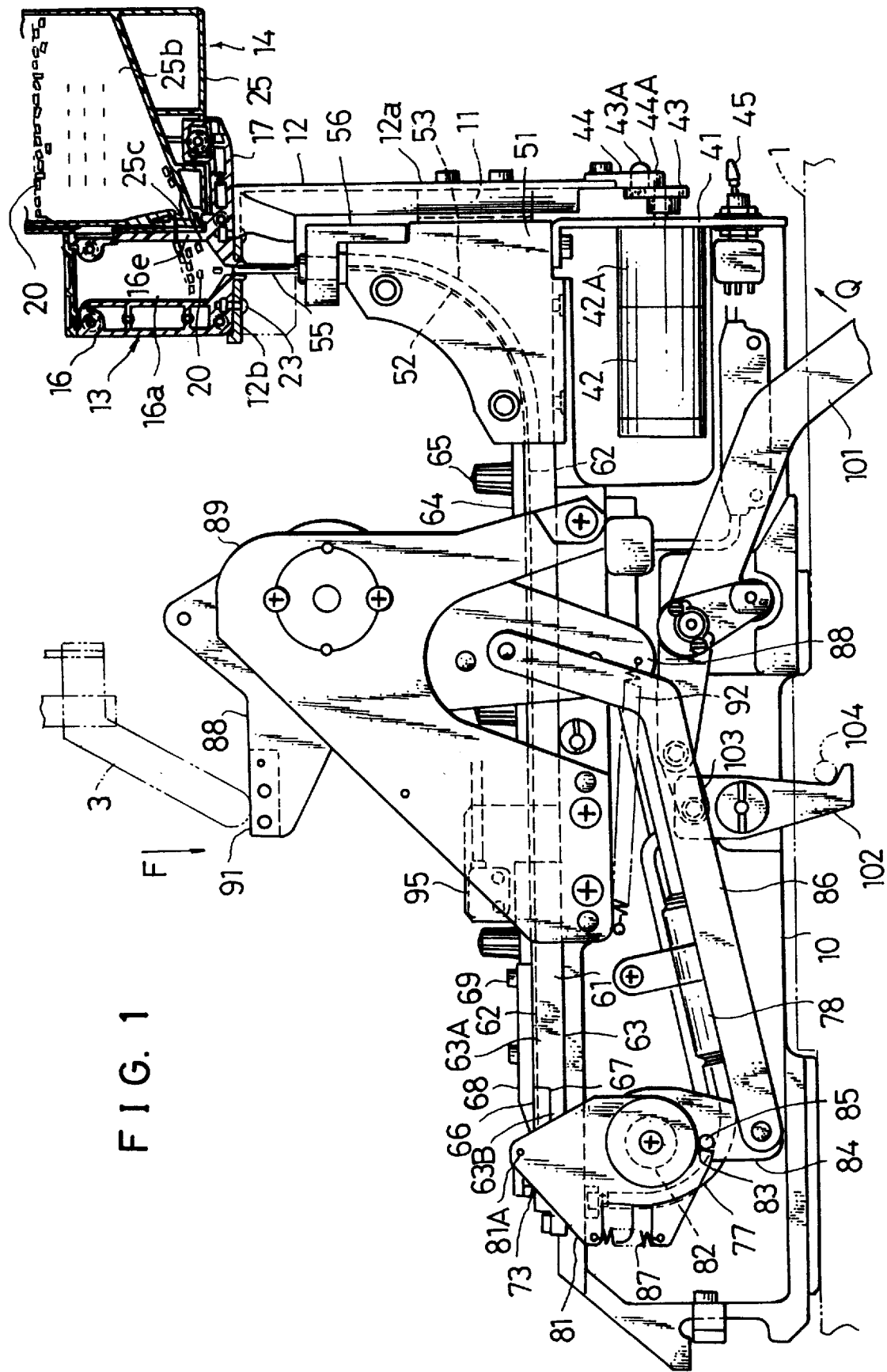
FIG. 1 is a front elevation view partly in section generally showing an embodiment of a chip feed apparatus according to the present invention, which has a chip feed casing incorporated therein.

Referring first to FIG. 1, an embodiment of a chip feed apparatus which has a chip feed casing incorporated therein is illustrated. In FIG. 1, reference numeral 1 designates a base for a feed section of a chip mounting apparatus. A chip feed apparatus of the illustrated embodiment includes a body frame 10 mounted on the base 1.

The body frame 10 of the chip feed apparatus is mounted on one end thereof or a right side end thereof with a precision ball slide 11 in a manner to be vertically slidable. The precision ball slide 11 has an L-shaped hopper base 12 fixed thereon through a vertical section 12a of the hopper base 12. Reference numeral 13 designates a hopper, on which a chip feed casing 14 having chips 20 stored or received therein is detachably or replaceably held in a manner to communicate with the hopper 13 as described hereinafter, so that the chips 20 received in the chip feed casing 14 are fed therefrom to the hopper 13. The hopper 13 is fixedly mounted on a horizontal section 12b of the hopper base 12.

The hopper 13, as shown in FIGS. 3 to 7, includes a hopper body 16 formed by integrally joining hopper halves 13a and 13b made of, for example, resin or metal to each other by a suitable means such as screws, a screw-nut combination, ultrasonic welding or the like, resulting in a chip storage space 16a being defined therein. The hopper 13 also includes an extending holding section 17 integrally connected to a bottom of the hopper body 16 so as to horizontally extend therefrom and fitted in a lower portion of the chip feed casing 14.

The extending holding section 17 has an upper surface formed so as to function as a chip feed casing support surface, which is formed on a portion thereof in proximity to the hopper body 16 with a first position projection 17a for positioning a bottom surface of the chip feed casing 14 in a longitudinal direction thereof. Also, the extending holding section 17 is formed thereon with a second positioning projection 17b for positioning the bottom surface of the chip feed casing 14 in a lateral direction thereof. The second positioning projection 17b is formed with a thickness substantially smaller than a lateral length or width of the bottom surface of the chip feed casing 14.

The hopper body 16 includes a side wall from which the extending holding section 17 extends. The side wall of the hopper body 16 has an outer surface connected to the chip feed casing 14, thus, it will be noted that the outer surface of the side wall is defined to be a chip feed casing connected surface. The side wall of the hopper body 16 is integrally fixedly formed thereon with a pair of holding pawls 18 made of a flexible resin material. The holding pawls 18 are arranged so as to outwardly project from the chip feed casing connected surface of the side wall. The holding pawls 18 are each formed on an outer side of a distal portion thereof with a holding projection 18a, which has a tip end formed into a shape thin sufficiently to facilitate insertion of the holding projection 18a described hereinafter. The holding pawls 18 function to position the chip feed casing 14 in a vertical direction thereof and hold the chip feed casing 14 so as to prevent the casing 14 from being released from the hopper 13, as described hereinafter.

The hopper body 16 is formed on a bottom surface thereof with a projection 16c in a manner to downwardly project therefrom and the chip storage space 16a in the hopper body 16 is formed at a lower portion thereof into a funnel-like shape in section, which is defined by an funnel-like inner surface 16b of the funnel-shaped bottom of the hopper body. The projection 16c is formed with a through-hole 16d in a manner to communicate with a funnel-like lower portion of the chip storage space 16a thus formed. The above-described chip feed casing connected surface of the hopper body 16 is formed with a chip inlet 16e in a manner to communicate at a portion thereof somewhat above the funnel-like inner bottom surface 16b with the chip storage space 16a. The hopper body 16 is formed at an upper wall thereof with an opening communicating with the chip storage space 16a, so that replenishment of chips 20 to the chip storage space 16a or removal of chips 20 from the chip storage space may be carried out through the opening. The opening is selectively covered by a sliding-type lid 19 slidably fitted therein in a horizontal direction as indicated at arrows X1 in FIGS. 3 to 5. The lid 19 may be arranged so as to be detachable with respect to the hopper body 16.

The extending holding section 17 is formed on a distal end surface thereof with a colored chip fitting hole 17c, in which a colored chip 24 is fitted in a manner to be visually observed. The colored chip 24 is previously fitted in the hole 17c in correspondence to a type of chips 20 to be fed, to thereby facilitate replacement of the chip feed casing 14 beyond mistake.

The hopper 13 is formed on a surface thereof through which it is mounted on the hopper base 12 with blind holes 21 for mounting. The blind holes 21 are each mounted in an intermediate portion thereof with a nut 22, so that the hopper 13 is fixedly mounted on the horizontal portion 12b of the hopper base 12 through a combination of the blind holes 21 and nuts 22 by means of screws 25. The projection 16c on the bottom of the hopper 13 is inserted through the horizontal portion 12b. The hopper 13 may be constructed so as to be detachably mounted on the horizontal portion 12b of the hopper base 12.

The chip feed casing 14 which is formed separately from the hopper 13 and detachably connected to the hopper 13, as shown in FIGS. 3 to 5 and 8 to 15, includes a casing body 25 made of transparent antistatic resin or the like, an upper lid 26 for the casing 14 made of resin or metal, and a shutter 27 for the casing 14 made of resin or metal.

Figure 3:
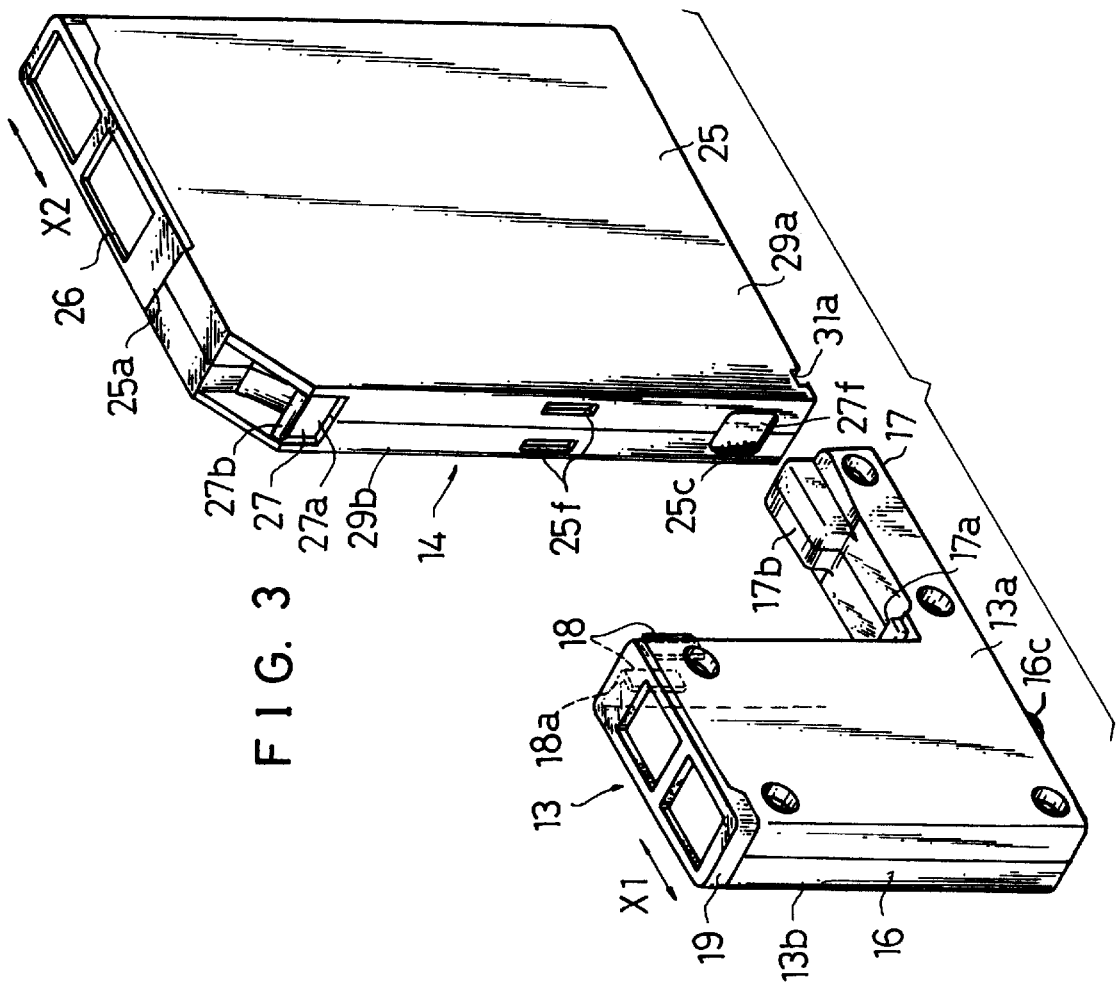
FIG. 3 is an exploded perspective view showing a hopper and a chip feed casing incorporated in the chip feed apparatus of FIG. 1.
Figure 2:
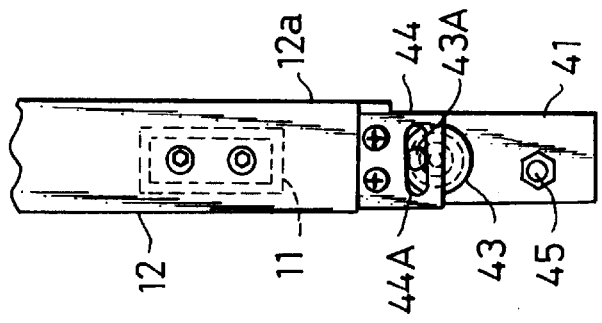
FIG. 2 is a fragmentary right side elevation view of the chip feed apparatus shown in FIG. 1.

The casing body 25 is integrally formed by joining two lateral casing halves 29a and 29b to each other by ultrasonic welding or the like as shown in FIG. 3. The casing body 25 is formed at an upper wall thereof with a chip inlet 25a and therein with a chip receiving space 25b communicating with the chip inlet 25a. Also, the casing body 25 is formed on an outer surface or hopper connected surface of a first side wall thereof connected to the chip feed casing connected surface of the hopper body 16 with a chip outlet 25c in a manner to positionally correspond to the chip inlet 16e of the hopper 13. The chip receiving space 25b has a lower end terminated by an inclined inner surface 25d of a lateral partition inclinedly arranged in the casing body 25 so as to downwardly obliquely extend to the chip outlet 25c. It is desirable that the inclined inner surface 25d is formed in a manner to be inclined at an angle of 20 to 45 degrees with respect to a horizontal plane. The inclination angle below 20 degrees fails to permit chips 20 to be smoothly transferred toward the chip outlet 25c, whereas that above 45 degrees causes a pressure applied to chips adjacent to the chip outlet 25c by a weight of chips in the casing body 25 to be significantly increased, to thereby prevent smooth discharge of chips from the chip outlet 25c and reduce a volume of the chip receiving space 25b. In the illustrated embodiment, in order to ensure that all chips 20 in the chip receiving space 25b are positively discharged through the chip outlet 25c, the chip outlet 25c communicating with the chip receiving space 25b includes an edge portion positioned at a lowermost end of the chip receiving space 25b or therebelow.

The casing body 25 of the chip feed casing 14 is provided on a portion of an inner surface of the above-described first side wall thereof positioned above the chip outlet 25c with an overhang portion 25e. The overhang portion 25e is shaped in the form of a projection of a substantially triangular shape in section, to thereby be inwardly projected above the chip outlet 25c in the chip receiving space 25b, resulting in preventing a weight of chips 20 immediately above chips 20 in proximity to the chip outlet 25c above from being applied directly to the latter chips 20 in proximity to the chip outlet 25c. This ensures smooth discharge of the latter chips 20 from the chip outlet 25c.

Figure 11:
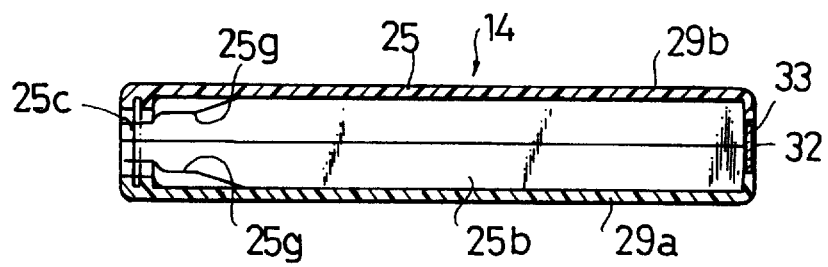
FIG. 11 is a sectional plan view of the chip feed casing shown in FIG. 3.
Figure 12:
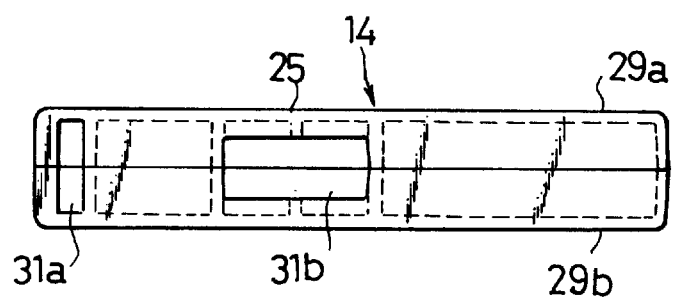
FIG. 12 is a bottom view of the chip feed casing shown in FIG. 3.

As shown in FIG. 11, in order to gradually coincide a lateral width of a portion of the chip receiving space 25b in proximity to the chip outlet 25c with a lateral width of the chip outlet 25c toward the chip outlet 25c, the chip receiving space 25b is provided on each of both sides of a region thereof in proximity to the chip outlet 25c with a thick-wall portion 25g.

The casing body 25 of the chip feed casing 14 is formed on an outer surface of a bottom thereof with a first positioning recess 31a in which the first positioning projection 17a of the extending holding section 17 of the hopper 13 is fitted, as well as a second positioning recess or cutout 31b in which the second positioning projection 17b of the extending holding section 17 is fitted. The first positioning projection 17a and first positioning recess 31a cooperate with each other to provide a first positioning means for positioning the bottom of the chip feed casing 14 in a longitudinal direction thereof with respect to the hopper 13. Likewise, the second positioning projection 17b and the second positioning recess 31b fitted on the projection 17b cooperate with each other to provide a second positioning means for positioning the bottom of the chip feed casing 14 in a lateral direction thereof with respect to the hopper 13.

Figure 13:
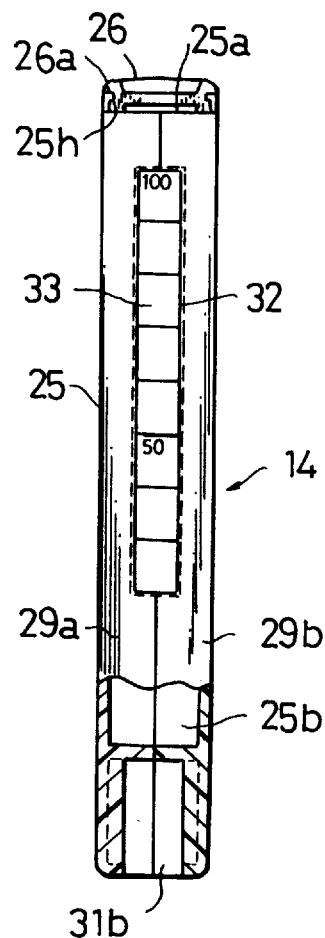
FIG. 13 is a right side elevation view of the chip feed casing shown in FIG. 3.

The casing body 25 also includes a second side wall arranged opposite to the above-described first side wall. The second side wall, as shown in FIG. 13, is formed with an elongated window 32 vertically extending, which has a transparent resin plate 33 fitted therein so as to permit residues of chips 20 in the chip receiving space 25b to be visually checked.

The casing body 25 is formed on the inner surface of the first side wall thereof with a straight groove 30 for vertically slidably guiding the casing shutter 27. The outer surface or hopper connected surface of the first side wall of the casing body 25, as shown in FIGS. 3, 6, 8 and 9, is formed with a pair of slits or holes 25f in which the holding pawls 18 in a pair provided on the hopper body 16 are engagedly fitted. The slits or holes 25f are formed in a manner to communicate with the straight shutter guide groove 30, so that the shutter guide groove 30 also acts as an engagement groove in which the holding projection 18a of each of the holding pawls 18 is engagedly fitted.

Figure 8:
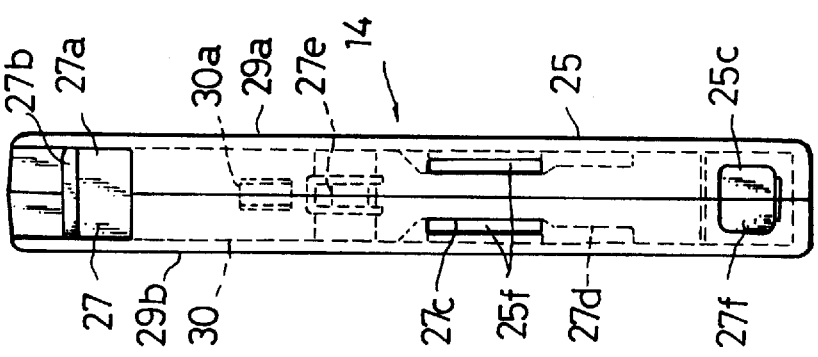
FIG. 8 is a left side elevation view of the chip feed casing shown in FIG. 3, wherein a casing shutter is closed.
Figure 9:
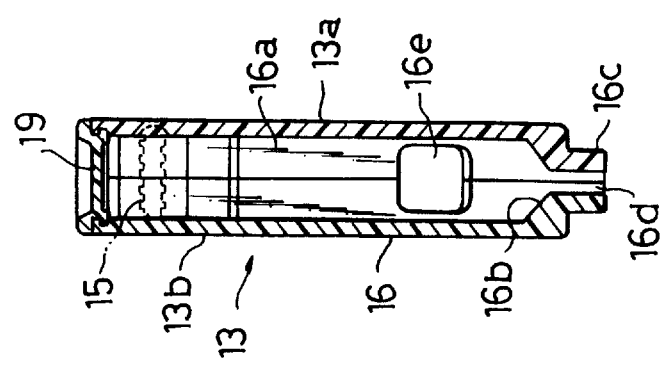
FIG. 9 is a left side elevation view of the chip feed casing shown in FIG. 3, wherein a casing shutter is open.
Figure 10:
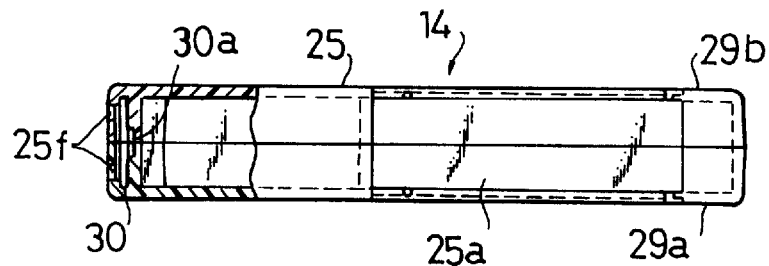
FIG. 10 is a partially sectional plan view of the chip feed casing shown in FIG. 3, wherein an upper lid of the casing is removed therefrom for the sake of brevity.

The casing shutter 27, as shown in FIGS. 8 and 9, acts to selectively open or close the chip outlet 25c of the casing body 25. For this purpose, the casing shutter 27 includes a plate-like sheet member 27a made of a resin material, which is provided at an upper end thereof with a lug 27b. Also, the sheet member 27a is provided at an intermediate position thereof with first and second reduced-width portions 27c and 27d, each of which is formed with a width sufficient to the portion to pass between the holding pawls 18. Further, the sheet member 27a is provided at a position thereof above the first reduced-width portion 27c with a stopper 27e. The sheet member 27a is formed at a lower position thereof with a thin-wall portion 27f of which a thickness is reduced and correspondingly the shutter guide groove 30 is reduced in depth at a lower portion thereof, to thereby prevent chips 20 from being caught in the shutter guide groove 30.

The casing shutter 27 thus constructed is slidably fitted in the shutter guide groove 30 during integral joining of the casing halves 29a and 29b to each other while keeping the lug 27b projected from the upper end of the casing body 25 for vertical operation. The casing shutter 27 is moved between a lowered position at which the thin-wall portion 27f is abutted against a lower end of the shutter guide groove 30 and a raised position at which the stopper 27e is caught in a stopper holding recess 30a of the shutter guide groove 30, to thereby be prevented from further upwardly moving.

The casing shutter 27 is so constructed that the first width-reduced portion 27c is formed with a width smaller than the second width-reduced portion 27d, to thereby ensure smooth movement of the holding pawls 18 of the hopper body 16. Thus, when the casing shutter 27 is downwardly moved to the lowered position to close the chip outlet 25c, the chip feed casing 14 is permitted to be detached from the hopper 13.

Figure 6:
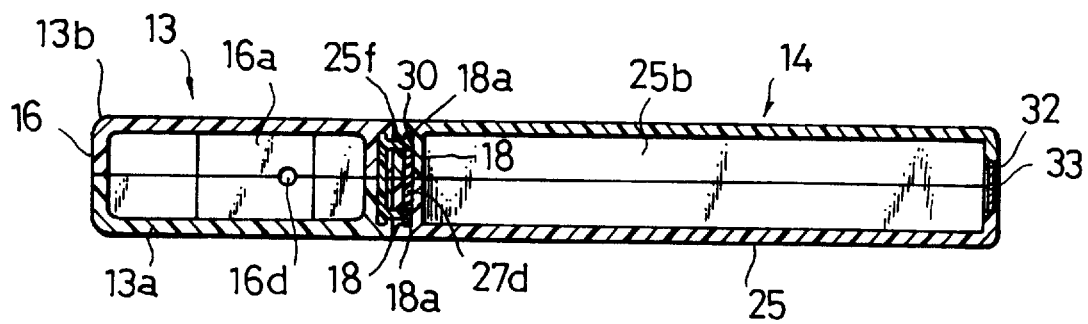
FIG. 6 is a sectional plan view of the hopper and chip feed casing shown in FIG. 3 which are connected to each other.
Figure 7:
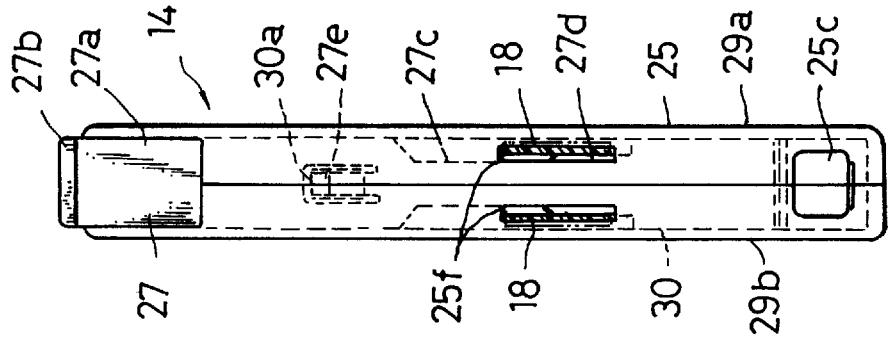
FIG. 7 is a side elevation view in section of the hopper shown in FIG. 3.

On the contrary, when the hopper 13 is connected to the chip feed casing 14 and then the casing shutter 27 is upwardly moved to render the chip outlet 25c open as shown in FIG. 9, the second width-reduced portion 27 of a relatively large width is snugly fitted between the holding pawls 18 in a pair as shown in FIG. 6, resulting in inward movement of the holding pawls 18 being prevented to keep the holding pawls 18 from being released from the casing body 25. This keeps the casing body 25 from being accidentally or undesirably released from the hopper 13, to thereby prevent scattering of chips 20 due to release of the casing body 25 from the hopper 13 when the casing shutter 27 is kept open.

Figure 4:
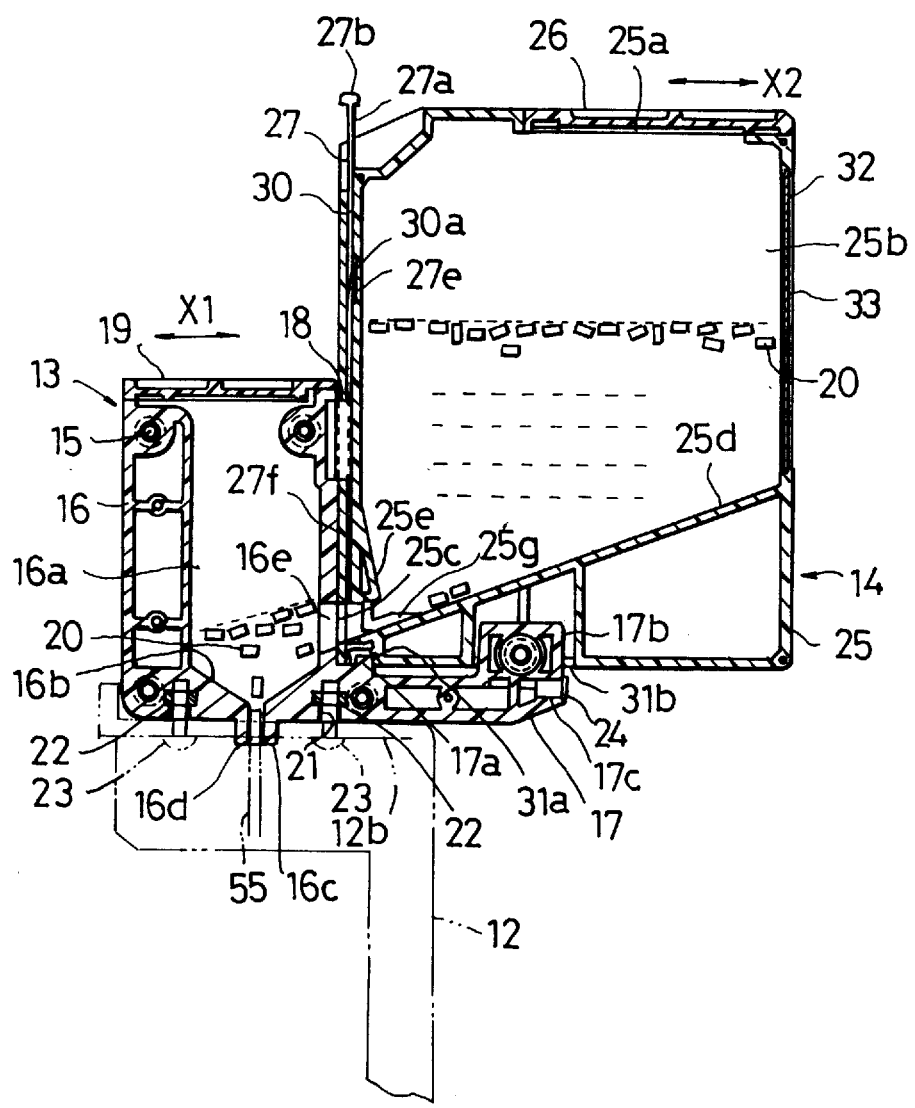
FIG. 4 is a front elevation view in section showing a combination of the hopper and chip feed casing of FIG. 3 which are connected to each other.
Figure 5:
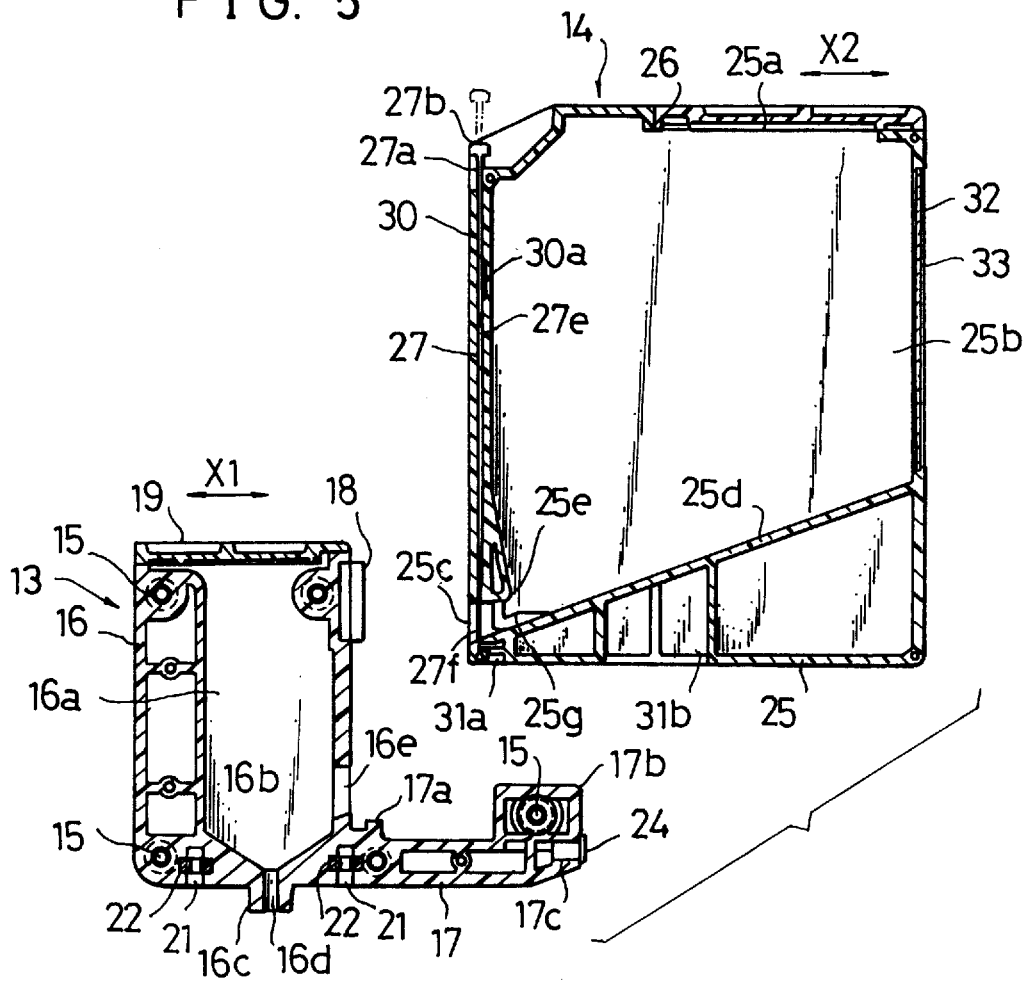
FIG. 5 is an exploded front elevation view in section of the hopper and chip feed casing shown in FIG. 3.

The upper lid 26 of the casing 14 is fitted in the chip inlet 25a of the casing body 25 in a manner to be slidable in directions indicated at arrows X2 in FIGS. 3 to 5. The upper lid 26, as shown in FIG. 13, is formed on each of both sides thereof with a slide recess 26a engaged with a horizontal guide projection 25h formed on each of side surfaces of the chip inlet 25a. The upper lid 26 may be detachably fitted in the chip inlet 25a as required.

Operation of separating the chip feed casing 14 from the hopper 13 and replenish the chip feed casing 14 with bulk chips 20 is readily carried out by operating the upper lid 26 of the casing 14 to open the chip inlet 25a and then dropping chips 20 through the chip inlet 25a into the receiving space 25b of the casing body 25 while downwardly forcing the lug 27b of the casing shutter 27 to keep the chip outlet 25c closed. The chips 20 may be previously received in the chip feed casing 14. Also, during operation of the hopper 13, the upper lid 26 of the casing 14 may be operated to render the chip inlet 25a open to replenish chips 20 from the chip inlet 25a into the chip feed casing 14, during which the chips 20 are collected at a lower portion of the receiving space 25b by gravity.

Then, the chip feed casing 14 is put at the lower portion thereof on the extending holding section 17 of the hopper 13 and then the hopper connected surface of the chip feed casing 14 is brought into a tight contact with the chip feed casing connected surface of the hopper body 16. This results in the first and second positioning projections 17a and 17b of the extending holding section 17 being respectively fitted in the first and second positioning recesses 31a and 31b of the casing 14, as well as the holding pawls 18 of the hopper body 16 being engagedly fitted in the holes 25f of the casing 14, to thereby ensure positioning of the bottom of the chip feed casing 14 in both longitudinal and lateral directions with respect to the hopper 13 and alignment between the chip feed casing connected surface of the hopper body 16 and the hopper connected surface of the casing 14. This permits the chip outlet 25c of the casing 14 to be aligned with the chip inlet 16e of the hopper body 16. Then, the casing shutter 27 is vertically moved through the lug 27b to open the chip outlet 25c of the casing 14, so that chips 20 may be fed from the chip receiving space 25b of the chip feed casing 14 through the chip outlet 25c and chip inlet 16e to the chip storage space 16a of the hopper body 16.

In order to prevent chips 20 from being caught in the chip outlet 25c and chip inlet 16e during feeding of chips from the chip feed casing 14 to the hopper body 16, the chip outlet 25c and chip inlet 16e are each desirably formed so that a bottom surface thereof is inclined like the inclined surface 25d of the chip receiving space 25b while being aligned with an extension plane of the inclined inner bottom surface 25d of the chip receiving space 25b or positioned slightly below the extension plane. In this instance, it is required that the bottom surface of the chip inlet 16e is aligned with that of the chip outlet 25c or positioned therebelow.

When the casing shutter 27 is upwardly moved to open the chip outlet 25c, the second width-reduced portion 27d of the casing shutter 27 is snugly fitted between the holding pawls 18 to prevent movement of the pawls 18 in a width direction of the casing 14, so that the holding projections 18a of the holding pawls 18 are kept engagedly fitted in the shutter guide groove 30, to thereby keep the chip feed casing 14 from being detached from the hopper 13.

The body frame 10, as shown in FIG. 1, is fixedly mounted thereon with a support 51, which is mounted at an upper portion thereof with a chip separating and aligning pipe 55 through a pipe fixing block 56 in a manner to vertically extend. The chip separating and aligning pipe 55 thus arranged functions to align the chips 20 with each other while separating them from each other one by one.

The hopper base 12 mounted thereon with the hopper 13 described above is mounted on a right side end of the body frame 10 or support 51 in FIG. 1 in a manner to be vertically movable through the precision ball slide 11. Such vertical movement of the hopper base 12 is carried out by means of a hopper elevating DC motor 42. More particularly, as shown in FIG. 1, the body frame 10 is fixedly mounted on a lower portion of the right-hand end thereof with a motor mounting plate 42, on which the hopper elevating at motor 42 is fixed. The motor 42 includes a speed reducer 42A, of which a revolving shaft is mounted thereon with a cam 43. The cam 43 has a pin 43A fixed thereon. The hopper base 12 also has a cam follower 44 fixedly connected to a lower end thereof, which cam follower 44 is formed with a laterally elongate hole 44A. The pin 43A of the cam 43 is fitted in the elongate hole 44A of the cam follower 44. Thus, driving of the motor 42 causes the hopper base 12 and hopper 13 to be vertically reciprocated; during which downward movement of the hopper 13 causes an upper portion of the chip separating and aligning pipe 55 to be projected via the through-hole 16d of the hopper body 16 into the lower funnel-like portion of the storage space 16a. In FIG. 1, the hopper 13 is maintained at a raised position. Operation of the hopper elevating DC motor 42 is carried out by operation of an on-off switch 45. The switch 45 is kept turned on during operation of the motor 42 and turned off during replacement of the chip feed casing 14.

The support 51 mounted on the body frame 10 is provided with an arcuate chute 53 constituting a part of an alignment chute. The arcuate chute 53 includes a chute channel of an arcuate shape corresponding to about one quarter as long as a circle formed on a side surface of the support 51 so as to extend from an upper vertical position to a lower horizontal position and a chute cover arranged on the chute channel, resulting in providing an arcuate chip feed passage 52.

The body frame 10, as shown in FIG. 1, is provided at an upper portion thereof with a straight extending chute 61 including a straight chip feed passage 62 which communicates with a through-hole of the chip separating and aligning pipe 55 through the arcuate chip feed passage 52 of the arcuate chute 53. The straight chute 61 likewise constitutes a part of the alignment chute. The through-hole of the chip separating and aligning pipe 55 and the arcuate chip feed passage 52 of the arcuate chute 53 are arranged so as to communicate with each other in an identical section. Also, the straight chip feed passage 62 of the straight chute 61 is arranged so as to communicate at a right side end thereof with the arcuate chip feed passage 52 in an identical section. The straight chute 61 includes a straight groove or channel formed on a straight base 63 so as to be open on an upper surface of the base 63 and a chute cover 64 is arranged on the base 63 so as to cover the channel. The chute cover 64 is fixed on the straight base 63 by means of screws 65 threadedly inserted through the cover 64 into threaded holes formed at the straight base 63.

Also, as shown in FIGS. 14 to 17, the straight base 63 has a distal end or left side end reduced in a thickness, so that the straight base 63 includes a thick-wall portion 63A and a thin-wall portion 63B, between which a step is defined. The step has a chute distal member 67 fixed thereto, which is provided with a straight groove 66 in a manner to communicate with the straight groove of the straight base 63 in an identical section. The thick-wall portion 63A of the straight base 63 including the chute distal member 67 has a distal end chute cover 68 fixed on an upper surface of a distal end thereof by means of screws 69 threadedly fitted in threaded holes of the straight base 63.

Thus, the arcuate chute 53 and the straight chute 61 having the chute distal member 67 integrally provided at the distal end thereof cooperate with each other to provide the alignment chute described above. Also, the chip separating and aligning pipe 55 cooperates with the arcuate chip feed passage 52 of the arcuate chute 53, the straight chip feed passage 62 of the straight chute 61 and the straight groove 66 of the chute distal member 67 communicating in turn with the pipe 55 to provide a chip feed path. The chip feed path constituted by the chutes thus communicating with each other is preferably formed in an airtight manner except both open ends thereof.

Figure 14:
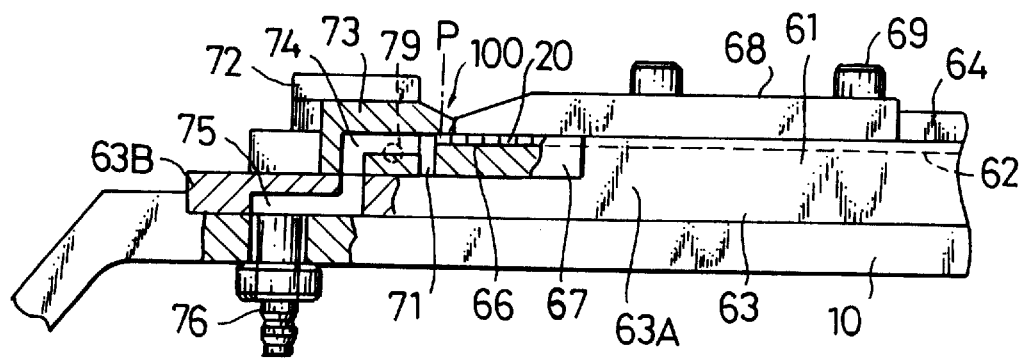
FIG. 14 is a partially sectional front elevation view showing a distal portion of an alignment chute incorporated in the chip feed apparatus shown in FIG. 1, wherein a shutter is closed.
Figure 15:
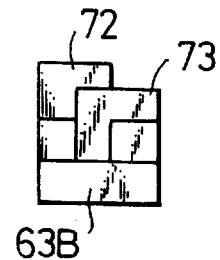
FIG. 15 is a left side elevation view of the distal portion of the alignment chute shown in FIG. 14.

The straight groove 66 of the chute distal member 67, as shown in FIGS. 14 to 17, is provided at a distal or left side end thereof with a chip stopper 71, which is fixed on the straight base 63. Also, the thin-wall portion 63B of the straight base 63 has a shutter 73 supported thereon in a manner to be horizontally movable through a stationary guide 72. The chip stopper 71, when foremost one of chips 20 is abutted at an end thereof against the stopper 71, functions to hold the chip 20 at a chip pick-up position P indicated at a dashed line. The chip stopper 71 is provided with a gap so as not to fully shield the whole straight groove 66, resulting in ensuring air suction. The shutter 73 is formed with an air suction hole 74, which is open on a distal end side of the chute distal member 67 and communicates with the straight groove 66. In FIG. 14, the shutter 73 is kept at a closed position and abutted against a distal end of the chute cover 68, wherein the air suction hole 74 is permitted to communicate with an air suction hole 75 provided at the thin-wall portion 63B of the straight base 63. Also, when the shutter 73 is at the closed position, the distal end of the shutter closes the upper surface of the straight groove 66, to thereby cover a chip outlet opening 100 defined at the chip pick-up position P shown in FIG. 16. The chip outlet opening 100 is a gap defined between the shutter 73 and the chute cover 68 above the straight groove 66 when the shutter 73 is retracted.

The air suction hole 75 is arranged so as to communicate at a lower end thereof with a suitable joint 76 provided at the body frame 10 and connected through a hose 77 (FIG. 1), which is connected to the joint 76, to a vacuum source or vacuum ejector 78 fixed on the body frame 10 so as to act as a negative pressure source. Thus, when the shutter 73 is at the closed position, the air suction hole 74 of the shutter 73 is permitted to communicate with the air suction hole 75 of the straight base 63, resulting in being connected through the joint 76 and hose 77 to the vacuum source 78. In the illustrated embodiment, a filter may be arranged in the middle of an air suction passage or path thus provided.

Figure 16:
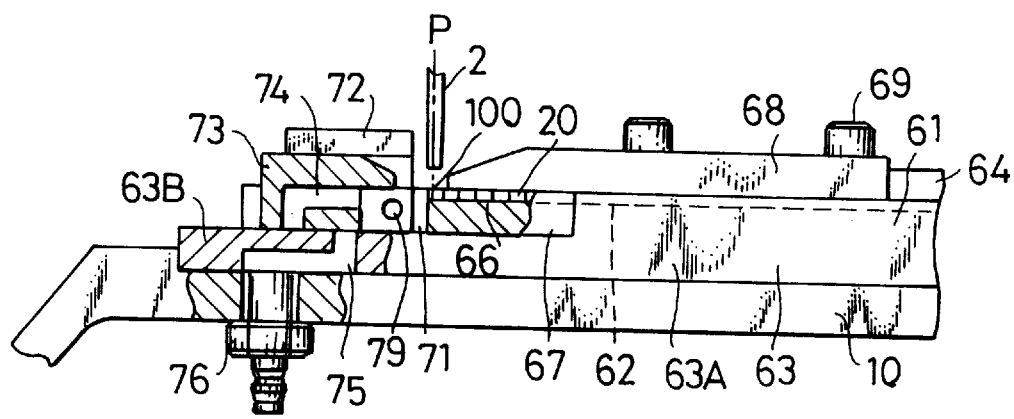
FIG. 16 is a partially sectional front elevation view of the distal portion of the alignment chute shown in FIG. 14, wherein the shutter is fully open.

The guide 72 for slidably supporting the shutter 73, as shown in FIGS. 14 and 16, is formed on a side surface thereof with an external communication hole 79. The external communication hole 79 is closed by the shutter 73, to thereby be kept from communicating with an exterior when the shutter 73 closes the chip outlet opening 100 at the chip pick-up position P and starts to communicate with an exterior to form an air passage when the shutter 73 is rendered partly open. The external communication hole 79 continues to form the air passage until the shutter 73 is further open to cause the air suction hole 74 to be released from the air suction hole 75 of the straight base 63, during which air suction by the air suction hole 74 is not substantially carried out. Also, when the shutter is fully open as shown in FIG. 16, a bottom surface of the shutter 73 closes an upper end of the air suction hole 75 to interrupt the air suction passage and render the chip outlet opening 100 open, so that suction force is not applied to the chip even when air suction is continued through the vacuum source 78. Thus, the chip is not exposed to suction force when the shutter is open, so that the chip 20 positioned at the chip outlet opening 100 is kept from being exposed to useless force due to suction of air, to thereby effectively prevent a variation in posture of the chip floating.

The shutter 73, as shown in FIG. 1, is engaged with a pin 81A provided on an upper end of a shutter operation arm 81. The shutter operation arm 81 is pivotally supported on a support shaft 82 fixed on the body frame 10 and provided at a lower end thereof with an engagement 83. The support shaft 82 also has a pivotal lever 84 pivotally supported thereon, which is provided with an engagement pin 85 with which the engagement 83 is engaged. Reference numeral 86 designates a connection arm of which one end is pivotally connected to a lower end of the pivotal lever 84. The shutter operation arm 81 and pivotal lever 84 are connected to each other through a tension spring 87, which functions to force the engagement 83 of the shutter operation arm 81 in a direction of causing the engagement 83 to be engaged with the engagement pin 85 of the pivotal lever 84. This results in rotation of the pivotal lever 84 in a counterclockwise direction in FIG. 1, to thereby cause the shutter operation arm 81 to be rotated in a counterclockwise direction in a manner to follow the engagement pin 85, so that the shutter 73 is slid in a left-hand direction, resulting in being open. Rotation of the pivotal lever 84 in a clockwise direction causes the shutter operation arm 81 to be rotated in a clockwise direction in FIG. 1 because the engagement 83 is forced by the engagement pin 85, so that the shutter 73 is slid in a right-hand direction in FIG. 1, resulting in being closed.

The connection arm 86 is pivotally connected at the other end thereof to an operation lever 88. The operation lever 88 is pivotally supported on a support plate 89 fixed on the frame body 10 and provided at an upper portion thereof with an operation section 91, to which operation force F is applied from a pusher 3 arranged on the chip mounting apparatus to rotate the operation lever 88 in a counterclockwise direction. Application of the operation force F from the pusher 3, when a suction pin 2 arranged on the chip mounting apparatus for picking up a chip as shown in FIG. 16 suckedly picks up a chip 20 at the chip pick-up position P, is carried out in association with downward movement of the suction pin 2. A tension spring 92 is arranged between a lower end of the operation lever 88 and the body frame 10, to thereby force the operation lever 88 so as to rotate it in a clockwise direction when the suction pin 2 is returned to a raised position to release the operation section 91 from the operation force F applied thereto. When the operation force F is applied to the operation lever 88 from the pusher 3, the operation lever 88 is pivotally moved in a counterclockwise direction or in a left-hand direction to pull the connection arm 86, to thereby pivotally move the pivotal lever 84 in a counterclockwise direction. When the operation lever 88 is released from the operation force F applied thereto from the pusher 3, the tension spring 92 causes the operation lever 88 to be pivotally move in a clockwise direction or in a right-hand direction.

As described above, operation of the shutter 73 is carried out through associated operation of the shutter operation arm 81, pivotal lever 84, connection arm 86 and operation lever 88. For this purpose, the shutter operation arm 81 and pivotal lever 84 are connected to each other through the tension spring 87, resulting in rotation or pivotal movement of the pivotal lever 84 in a counterclockwise direction causing pivotal movement or rotation of the shutter operation arm 81 in a counterclockwise direction; so that when any trouble occurs during opening operation of the shutter 73 or sliding operation of the shutter 73 in a left-hand direction to cause force sufficient to obstruct pivotal movement of the shutter operation arm 81 in the counterclockwise direction or force exceeding elastic force of the tension spring 87 to be applied thereto, the force is effectively absorbed by extension of the tension spring 87, to thereby prevent the shutter operation arm 81 from forcibly following the pivotal movement of the pivotal lever 84 in the counterclockwise direction. Also, pivotal movement of the shutter operation arm 81 and pivotal lever 84 in the clockwise direction is carried out through the connection arm 86 using elastic force of the tension spring 92 arranged between the operation lever 88 and the body frame 10 or force which presses the operation lever 88 in the clockwise direction. Thus, when any trouble occurs during closing operation of the shutter 73 or sliding operation of the shutter 73 in a right-hand direction to cause force sufficient to obstruct pivotal movement of the shutter operation arm 81 and pivotal lever 84 in the clockwise direction or force exceeding elastic force of the tension spring 87 to be applied thereto, pivotal movement of the operation lever 88 is stopped, to thereby prevent the shutter operation arm 81 and pivotal lever 84 from forcibly following the pivotal movement of the pivotal lever 84 in the clockwise direction. This results in forcible operation of the shutter 73 being effectively prevented when any trouble such as clogging of a chip 20 in the gap between the shutter 73 and the chute cover 68 or in the chip outlet opening 100 or the like occurs.

Figure 17:
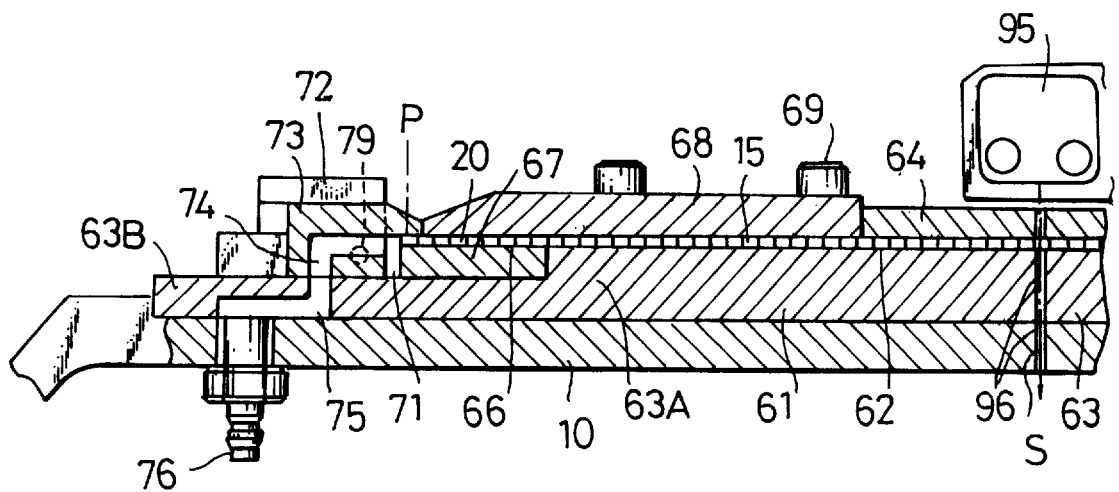
FIG. 17 is a partially sectional front elevation view showing arrangement of a photosensor incorporated in the chip feed apparatus shown in FIG. 1 so as to function as a chip detection sensor.

The straight chute 61, as shown in FIG. 17, is provided on a portion thereof somewhat deviated in a left-hand direction from a middle portion thereof with a photosensor 95 acting as a chip detection sensor. The photosensor 95 includes a light emitting element and a light receiving element (not shown) which are mounted on the body frame 10 in a manner to be opposite to each other with the chip feed passage 62 of the straight chute,61 being interposed therebetween. The chute cover 64 and straight base 63 are formed with a common fine through-hole 96 which permits light emitted from the light emitting element to be transmitted to the light receiving element therethrough, so that an optical path indicated at a dashed line S in FIG. 17 is defined so as to penetrate the straight chip feed passage 62. Thus, when a chip 20 is positioned on the optical path S of the photosensor 95 in the chip feed passage 62, the optical path S is interrupted, resulting in the chip 20 being detected. When the photosensor 95 thus detects the chip 20, the DC motor 42 is turned off to interrupt operation of the hopper 15, to thereby stop feeding of chips 20. On-off operation of the sensor 95 is instantaneously carried out every time when a chip 20 passes through the optical path S. However, the motor 42 has inertia, to thereby be substantially kept from being stopped. When an end of an array of chips 20 aligned with each other by the chip stopper 71 continuously intercepts light of the photosensor 95 as shown in FIG. 17, operation of the DC motor 42 is stopped. This permits a suitable number of chips 20 to exist in the straight chip feed passage 62.

In the illustrated embodiment, the photosensor 95 is the transmission type wherein the light emitting element and light receiving element are arranged opposite to each other. Alternatively, it may be the reflection type wherein the both elements are juxtaposed to each other.

The body frame 10, as shown in FIG. 1, is mounted thereon with a feeder lock lever 101 and a lock pawl 102. The feeder lock lever 101 and lock pawl 102 are each pivotally connected to the frame body 10 and connected to each other through a connection link 103. A spring (not shown) is arranged between the feeder lock lever 101 and the body frame 10 to force the feeder lock lever 101 in a lock direction or in a clockwise direction in FIG. 1. The lock pawl 102 is released from a pin 104 provided on the chip mounting apparatus when the feeder lock lever 101 is upwardly pivotally moved as indicated at an arrow Q in FIG. 1, to thereby permit the body frame 10 and all mechanisms attached thereto to be released from the base 1. When the feeder lock lever 101 is kept at a position indicated at solid lines in FIG. 1, the body frame 10 is mounted in the base 1 and the lock pawl 102 is engaged with the pin 104.

Now, the manner of operation of the chip feed apparatus of the illustrated embodiment thus constructed will be described hereinafter.

First, the hopper 13 fixed on the hopper base 12 is mounted thereon with the chip feed casing 14 charged therein with a number of chips 20. Then, the casing shutter 27 of the chip feed casing 14 is rendered open, to thereby be ready for permitting chips 20 in the chip receiving space 25b of the chip feed casing 14 to be fed to the chip storage space 16a of the hopper body 16 through the chip outlet 25c and chip inlet 16e aligned with each other.

Then, the switch 45 is turned on, to thereby be ready to permit the hopper elevating DC motor 42 to be driven. When the photosensor 95 does not detect an end of an array of chips 20 aligned in the straight chip feed passage 22, rotation of the DC motor 42 is carried out, to thereby vertically move the hopper base 12 and hopper 13 through the cam mechanism. This causes chips 20 in the chip receiving space 25b of the chip feed casing 14 to be slid on the inclined inner surface 25d toward the hopper body 16 and then fed to the chip storage space 16a of the hopper body 16 through the chip outlet 25c of the chip feed casing 14 and the chip inlet 16e of the hopper body 16. Concurrently, the chip separating and aligning pipe 55 is permitted to access to the lower funnel-like portion of the chip storage space 16a via the through-hole 16d of the hopper 13, to thereby vertically slightly move chips 20 in the chip storage space 16a. This results in bulk chips 20 in the chip storage space 16a entering or dropping into the through-hole of the chip separating and aligning pipe 55 vertically moved via the through-hole 16d communicating with the chip storage space 16a one by one.

Feeding of chips 20 from the chip feed casing 14 to the hopper body 16 is continued while the hopper 13 is vertically moved. In this connection, a height of storage of chips 20 in the chip storage space 16a of the hopper body 16 or the number of chips stored therein is determined depending on a height of a lower one of an upper edge of the chip inlet 16e of the chip body 16 and an upper edge of the chip outlet 25c of the casing body 25 of the chip feed casing 14. More particularly, gravity acting on chips 20 in the casing body 25 and vertical movement of the hopper 13 are to move the chips 20 along the inclined inner surface 25d of the chip feed casing 14 toward the storage space 16a. However, when chips 20 are stored in the chip storage space 16a to a level corresponding to the lower one of the upper edge of the chip outlet 25c and the upper edge of the chip inlet 16e, the chips stored in the chip storage space 16a substantially close the chip outlet 25c and chip inlet 16e, to thereby block feeding of chips 20 from the chip receiving space 25b to the chip storage space 16a. Then, when chips 20 in the chip storage space 16a are discharged in order through the chip separating and aligning pipe 55 to start formation of a gap between chips 20 in the chip storage space 16a and the upper edge of the chip outlet 25c or chip inlet 16e, chips 20 starts to be moved from the chip receiving space 25b toward the chip storage space 16a little by little. Such a phenomenon stably continues, to thereby ensure that a fixed amount of chips 20 are stored in the chip storage space 16a.

The chips 20 which have thus entered the chip separating and aligning pipe 55 are guided via the through-hole of the pipe 55 to the vertical portion of the arcuate chip feed passage 52 formed in the arcuate chute 53 and then fed to a left side end of the horizontal portion of the passage 52 while being gradually shifted into a horizontal direction.

The chips 20 are released from a chip feed action by gravity at the horizontal portion of the arcuate chip feed passage 52. Thus, as shown in FIG. 14, the chip outlet opening 100 at the chip pick-up position P on the distal end side of the straight chute 61 is closed by the shutter 73, to thereby render only the upper end of the chip separating and aligning pipe 55 substantially open and then vacuum suction takes place through the air suction path constituted by the air suction holes 74 and 75, the joint 76, and the hose 77 from the vacuum source 78. This results in air flow being generated through the chip feed passage constituted by the through-hole of the chip separating and aligning pipe 55, the arcuate chip feed passage 52, the straight chip feed passage 62 and the straight groove 66 communicating with each other in turn, so that chips 20 in the horizontal portion of the arcuate chip feed passage 52, straight chip feed passage 62 and straight groove 66 are forced in a left-hand direction in FIG. 1 and, as a result, foremost one of the chips 20 is abutted against the chip stopper 71, to thereby be stopped. This results in the foremost chip 20 being held at the chip pick-up position P defined at the chip outlet opening 100. The chip feed passage is kept substantially airtight, so that vacuum suction force acts on chips 20 even in the arcuate chip feed passage 52 via the through-hole, to thereby ensure smooth and positive dropping or falling of chips 20.

Then, the suction pin 2 (FIG. 16) of the chip mounting apparatus is lowered and operation force F is applied from the pusher 3 to the operation section 91 of the operation lever 88, so that the connection arm 86 and pivotal lever 84 are moved in association with each other, to thereby pivotally move the shutter operation arm 81 in a counterclockwise direction in FIG. 1, leading to sliding of the shutter 73 in a left-hand direction in FIG. 1. This results in the shutter 73 being partially open or half-open, to thereby form an air passage wherein the external communication hole 79 communicates with an exterior, so that air suction through the air suction hole 74 is substantially ineffective. When the shutter 73 is rendered further open, the bottom surface of the shutter 73 covers the upper opening of the air suction hole 75 to interrupt the air suction path, to thereby further keep air suction from acting on chips 20. Thereafter, when the shutter 73 is fully open or the chip pick-up opening 100 is fully open as shown in FIG. 16, the suction pin 2 is lowered to suckedly hold thereon the foremost chip 20 at the chip pick-up position P and then upwardly moved for transportation. During such operation of the suction pin 20, air suction extending to the air suction hole 75 of the straight base 63 is continued. However, the air suction hole 74 communicating with the straight chip feed passage 62 is kept from air suction operation, so that chips 20 are kept from application of suction force thereto. Thus, the chips 20 are released from feed force in a horizontal direction, to thereby be kept loosened from each other, resulting in eliminating a failure in pick-up of chips 20 by the suction pin 2.

When chips 20 are received in the chip feed passage 52 in a manner to be continuous from the horizontal portion thereof to the vertical portion thereof, there is likelihood that force in a horizontal direction by gravity is applied to the foremost chip 20. Also, when force by gravity is applied to succeeding chips even when the suction is stopped, the chips in a row are kept from being loosened from each other. In order to eliminate the problem, the illustrated embodiment is so constructed that the photosensor 95 is arranged in the middle of the straight chute 61 to detect an array of chips 20 aligned with each other (an end of the array); so that when the array of chips aligned with each other is detected, operation of the DC motor 42 is interrupted to stop vertical movement of the hopper 13, resulting in feeding of chips to the chip feed path being stopped. Thus, during chip pick-up operation of the suction pin 2, chips 20 are permitted to be arranged in only the straight chute 61.

Then, the suction pin 2 is upwardly moved after suckedly holding the chip 20 thereon, so that the operation section 91 of the operation lever 88 is released from the operation force F applied thereto, therefore, the tension spring 92 causes the operation lever 88 to be pivotally moved in a clockwise direction in FIG. 1. Thus, the connection arm 86 and pivotal lever 84 are moved in association with each other to pivotally move the shutter operation arm 81 in a clockwise direction, resulting in the shutter 73 being slid in a left-hand direction in FIG. 1. This causes the shutter 73 to be operated to close the chip pick-up opening 100, so that the air suction hole 74 communicates with the air suction hole 75 of the straight base 63, to thereby render air suction through the air suction hole 74 effective. The air suction causes the chips 20 to be forcibly moved in a left-hand direction in FIG. 1, so that the foremost chip 20 is abutted against the chip stopper 71, to thereby be held at the chip pick-up position P defined at the chip outlet opening 100, resulting in being ready to be picked up by the suction pin 2.

The chip feed apparatus of the illustrated embodiment constructed as described above exhibits many significant advantages.

More particularly, the illustrated embodiment is so constructed that the hopper 13 includes the hopper body 16 having the chip storage space 16a defined therein and the extending holding section 17 and the chip feed casing 14 separate and detachable from the hopper 13 is securely mounted on the extending holding section 17 and connected to the side of the hopper body 16, resulting in bulk chips 20 being fed from the chip feed casing 14 to the chip storage space 16a. Such construction permits the chip feed casing 14 to be simplified in structure, leading to cost-saving, because it is not required to exhibit a function of separating chips 20 from each other one by one. Thus, the chip feed casing 14 may be conveniently used as a container for storage and transportation of chips in a distribution channel or system. Also, the chip feed casing 14 may be stably mounted on the hopper by merely putting it on the extending holding portion 17 while keeping it vertical, to thereby contribute to space-saving as compared with the above-described conventional casing inclinedly arranged.

The casing body 25 of the chip feed casing 14 is provided with the chip outlet 25c on one side surface thereof acting as the hopper connected surface and the hopper body 16 of the hopper 13 is provided with the chip inlet 16e on one side surface thereof acting as the chip feed casing connected surface, so that the chip feed casing 14 is laterally connected to the hopper body 16 while aligning the chip outlet 25c with the chip inlet 16e. Such lateral arrangement of the chip inlet 16e and chip outlet 25c, even when the chip feed casing 14 is so large-sized that a large number of chips may be stored therein, prevents a weight of chips in the casing 14 from being applied directly to the lower portion of the chip storage space 16a of the hopper 13.

When chips 20 fed from the chip feed casing 14 through the chip outlet 25c of the chip feed casing 14 and the chip inlet 16e of the hopper 13 into the chip storage space 16a of the hopper 13 are increase in amount to a degree sufficient to reach a lower one of an upper edge of the chip outlet 25c and an upper edge of the chip inlet 16e, the chip outlet 25c and chip inlet 16e are substantially clogged with the chips, resulting in transfer of chips from the chip feed casing 14 to the hopper 13 being naturally restrained. Thus, a height of chips in the chip storage space 16a of the hopper 13 or the number of the chips therein is kept substantially constant. This effectively prevents a weight of chips 20 in the chip storage space 16a of the hopper 13 applied to the lower portion of the chip storage space 16a from being excessively increased. Therefore, separation and feeding of chips are smoothly and positively accomplished through the hopper 13 and the chip separating and aligning pipe 55 irrespective of a size of the chip feed casing 14 and the amount of chips received in the chip feed casing 14.

Thus, the chip feed casing 4 may be large-sized to a degree sufficient to be conveniently used as a container for storage and transportation of chips in a distribution system. For example, when chips are small-sized, the chip feed casing may be formed so as to have a capacity of storing and transporting chips as many as 50,000 or more. Also, the chip feed casing 14 ensures stable feeding of chips to the hopper 13 irrespective of a size thereof. Thus, the chip feed casing 14 may be readily standardized for a distribution system When the hopper 13 is constructed into a common structure.

The extending holding section 17 of the hopper 15 and the chip feed casing 14 are provided with the first positioning means (a combination of the first positioning projection 17a and first positioning recess 31a) for positioning the bottom surface of the chip feed casing 14 in the longitudinal direction and the second positioning means (a combination of the second positioning projection 17b and second positioning recess 31b) for positioning the chip feed casing 14 in the lateral direction. Also, the chip feed casing connected surface of the hopper body 16 is provided thereon with the holding pawls 18 for vertical alignment and the hopper connected surface of the chip feed casing 14 is formed with the holes 25f in which the holding pawls 18 are engagedly fitted. Thus, the chip feed casing 14 may be accurately positioned with respect to the hopper 15 for mounting.

The bottom surface of the chip feed casing 14 defining the receiving space 25b in the casing 14 comprises the inclined inner surface 25d downwardly inclined toward the chip outlet 25c of the casing body 25 and the chip outlet 25c is defined so as to be aligned with the lowermost end of the chip receiving space 25b or lower than the lowermost end. Such construction permits transfer of chips from the chip receiving space 25b to the chip storage space 16a of the hopper body 16 to be efficiently and satisfactorily carried out, to thereby prevent chips 20 from finally remaining in the chip receiving space 25b.

The casing body 25 of the chip feed casing 14 is formed on the inner surface thereof defining the chip receiving space 25b with the overhang portion 25e so as to be positioned above the chip outlet 25c. This leads to a decrease in pressure due to a weight of upper chips applied to lower chips in proximity to the chip outlet 25c, to thereby permit chips to be smoothly discharged from the chip outlet 25c.

When the casing shutter 27 of the chip feed casing 14 mounted on the hopper 13 is operated to render the chip outlet 25c open, the casing shutter 27 regulates movement of the holding pawls 18 in a direction in which the pawls are released from the slits or holes 25f, to thereby prevent the chip feed casing 14 from being removed from the hopper 15. This effectively prevents the chip feed casing 14 from being disengaged from the hopper 13 while keeping the casing shutter 27 open by mistake, to thereby prevent chips 20 from being scattered.

Feeding or replenishment of chips 20 to the chip storage space 16a is accomplished through the chip feed casing 14 connected to the hopper 13. Also, it may be carried out directly through the lid 19 of the hopper body 16 rendered open. This permits excessive chips to be stored in the storage space 16a, so that feeding of chips 20 from the storage space 16a is possible for a while even when the chip feed casing 14 is kept detached from the hopper body 16, therefore, replenishment of chips to the space 16a may be safely carried out.

In the illustrated embodiment, separation of chips from each other one by one is carried out by vertically moving the hopper 13 to move a plurality of chips 20 and accessing the chip separating and aligning pipe 55 to the chip storage space 16a to drop chips 20 into the through-hole of the pipe 55 one by one. This permits identical motion to be imparted to chips in the space 16a under reduced load, to thereby prevent damage to the chips and pollution thereof as seen in separation and alignment of chips using compressed air, resulting the chips being fed while being kept properly separated and aligned.

Transfer of chips from the inlet of the chip feed passage or the lower end of the through-hole of the chip separating and aligning pipe 55 to the distal end or outlet of the passage or the distal end of the straight groove 66 of the chute distal member 67 is carried out by means of air suction. This minimizes pollution of an interior of the passage and scattering of dust or the like to an exterior of the apparatus, to thereby permit the apparatus to be suitable for a clean room.

Figure 18:
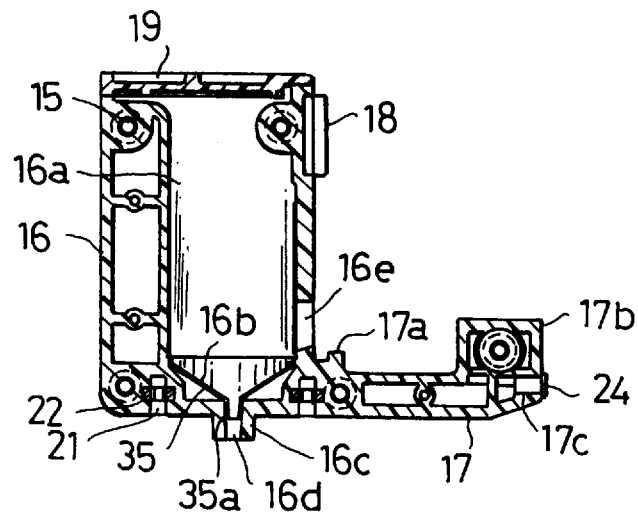
FIG. 18 is a sectional front elevation view showing a modification of the hopper shown in FIG. 3.

Referring now to FIG. 18, a modification of the hopper is illustrated. In a hopper of the modification, a funnel-like member 35 made of metal is fixedly arranged on a bottom of a chip storage space 16a defined in a hopper body 16, resulting in an upper surface of the funnel-like member 35 defining a funnel-like inner bottom surface 16b, which is a lower surface of the chip storage space 16a, so that the funnel-like inner bottom surface 16b may be increased in durability. The funnel-like member 35 has a lower cylindrical portion 35a provided at a lower end thereof, which portion is snugly fitted in a through-hole 16d of the hopper body 16. The remaining part of the hopper of the modification may be constructed in substantially the same manner as the hopper incorporated in the embodiment described above.

In the hopper of FIG. 18, the funnel-like inner bottom surface 16b is defined by, the funnel-like member 35, so that the funnel-like inner bottom surface 16b is kept from being deteriorated even when operation of the hopper is carried out in a repeated manner over a long period of time, resulting in ensuring smooth dropping of chips into the through-hole of the chip separating and aligning pipe 55. Also, such construction of the hopper eliminates any problem due to electrification of chips.

Figure 19:
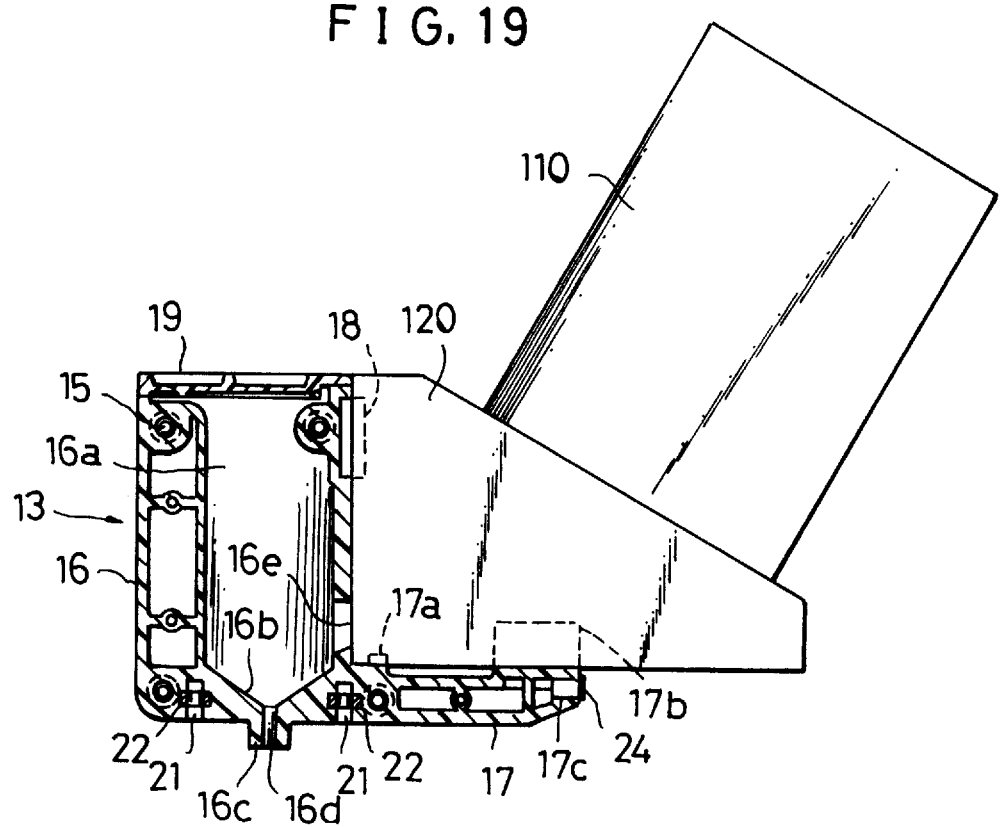
FIG. 19 is a front elevation view partly in section showing a combination of the hopper of FIG. 3 with a chip storage casing in place of a chip feed casing.

The embodiment described above, as shown in FIG. 19, may be constructed so that a chip storage casing 110 is mounted on the hopper 13 in place of the chip feed casing 14. The chip storage casing 110 is desirably arranged in an inclined manner. In this instance, an adapter 120 which is provided with a chip outlet and a positioning structure constructed in substantially the same manner as in the chip feed casing 14 is previously mounted on the hopper 13 and then the chip storage casing 110 is mounted on the adapter 120. The chip storage casing 110 is constructed so as to be mounted on the hopper 13 while being inclined at an angle of about 45 degrees. For this purpose, the adapter 120 is adapted to hold the chip storage casing 110 in an inclined manner.

In the embodiment described above, the inclined inner bottom surface 25d of the chip feed casing 14 is inclined at a constant angle. However, it is not required to form the inclination at a constant angle. In the embodiment, it is desirable that a portion of the inclined surface 25d in the vicinity of the chip outlet 25c is inclined at an angle between 20 degrees and 45 degrees.

Also, in the embodiment, the chip separating and aligning pipe 55 is arranged for separating chips from each other and aligning them with each other. The chip separating and aligning pipe 55 may be replaced with a chip separating member formed by arranging a pair of semi-cylindrical halves each provided with a groove in a manner to be opposite to each other and in proximity to each other or butting the halves against each other.

The embodiment described above may be suitably applied to both cylindrical chips and rectangular chips. When chips to be fed are cylindrical, the through-hole of the chip separating and aligning pipe 55 and the chip feed path communicating with the through-hole are formed into a circle in section i whereas when chips are rectangular, the section is formed into a rectangular shape.

Referring now to FIGS. 20 to 26, another embodiment of a chip feed apparatus according to the present invention is illustrated. The following description on the illustrated embodiment will be made in connection with feeding of rectangular chips. However, it is a matter of course that the embodiment may be conveniently applied to feeding of chips of a shape such as a cylindrical shape other than a rectangular shape, which chips have a polarity.

Figure 20:
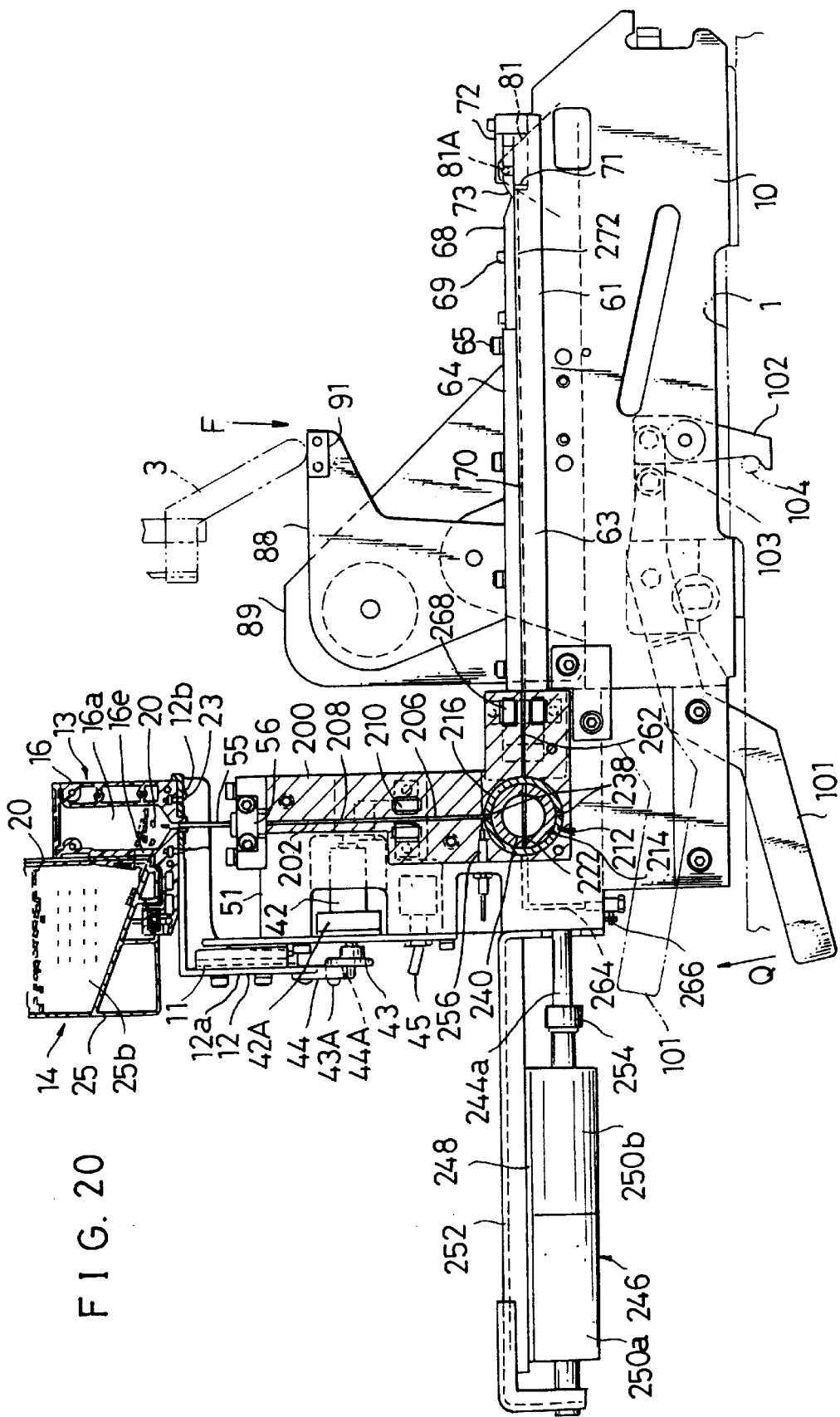
FIG. 20 is a front elevation view partly in section generally showing another embodiment of a chip feed apparatus according to the present invention, which is adapted to feed rectangular chips.

In a chip feed apparatus of the illustrated embodiment, a through-hole of a chip separating and aligning pipe 55 is formed into a rectangular shape in section and a size which permits one rectangular chip to pass through the through-hole while keeping a long side of the chip vertical. A support 51, as shown in FIG. 20, is fixedly mounted thereon with a grooved plate member 200 in a manner to vertically extend. The grooved plate member 200 is formed with a vertically extending groove 202, which is formed into a rectangular shape in section and connected to a lower end of the through-hole of the chip separating and aligning pipe 55, to thereby communicate with the through-hole. The grooved plate member 200 may be made of, for example, metal. The vertical groove 202 of the grooved plate member 200 is arranged so as to vertically linearly extend. The groove 202 has a front opening covered with a cover plate 204 made of a transparent resin material or the like, to thereby provide a vertical duct 206 through which rectangular chips drop by gravity. Thus, the through-hole of the chip separating and aligning pipe 55 and vertical duct 206 cooperate with each other to provide a chip dropping passage 208 through which rectangular chips drop by gravity. The vertical groove 202 is formed into the same section as the through-hole of the pipe 55 and formed with a width slightly larger than a thickness of a rectangular chip and a depth slightly larger than a short side of the chip. Formation of a transparent material into the cover plate 204 permits a rectangular chip dropping through the vertical groove 202 to be visually observed from the outside.

The chip dropping passage 208, as shown in FIG. 20, is provided in the middle thereof with a chip detection sensor 210. The sensor 210 may be arranged at a position somewhat below a central portion of the passage 208. The chip detection sensor 210 comprises a photosensor. When it is constructed into a transmission type, it includes a light emitting section and a light receiving section with the vertical groove 202 being interposed therebetween. For this purpose, the plate member 200 may be formed with a light guide groove or hole so as to extend in a direction perpendicular to the vertical groove 202, so that light emitted from the light emitting section is received by the light receiving section when any rectangular chip is not at a portion of the passage 208 between both sections of the sensor 210. When the sensor 210 detects a chip which is at a portion of the passage 208 between both sections of the sensor 210, a DC motor 42 is turned off to interrupt operation of a hopper 13, to thereby stop feeding of chips. On-off operation of the sensor 210 is instantaneously carried out every time when a chip passes through the passage 208. However, the motor 42 has inertia, to thereby be substantially kept from being stopped. When the row of chips aligned with each other upwardly extends from a lower end of the chip dropping passage 208 to continuously intercept light of the sensor 210, operation of the motor 42 is stopped. This indicates that a suitable amount of chips are in the chip dropping passage 208.

The chip feed apparatus of the illustrated embodiment also includes a direction shifting mechanism 212 arranged below the chip dropping passage 208, as shown in FIGS. 21 to 26. The direction shifting mechanism 212 may include a disc-like grooved stationary section 214 made of, for example, metal and a flat bottom-closed rotary section 216 of a cylindrical shape which is made of metal or the like.

The disc-like grooved stationary section 214 is provided thereon with a horizontal straight groove 218 of a rectangular shape in section in a manner to diametrically extend, which has a front opening covered with a lid plate 220, to thereby provide a horizontal stationary passage 222 acting as a duct. The lid plate 220 and stationary section 214 are integrally joined to each other by means of an adhesive or the like and the lid plate 220 is fixed to the grooved plate member 200 by means of screws 224. The horizontal groove 218 of a rectangular shape in section is formed with a width slightly larger than a thickness of a rectangular chip 20 and a depth slightly larger than a short side of the chip. Formation of a transparent material into the lid plate 220 permits chips 20 in the direction shifting mechanism 212 to be visually observed from the outside.

Figure 22:
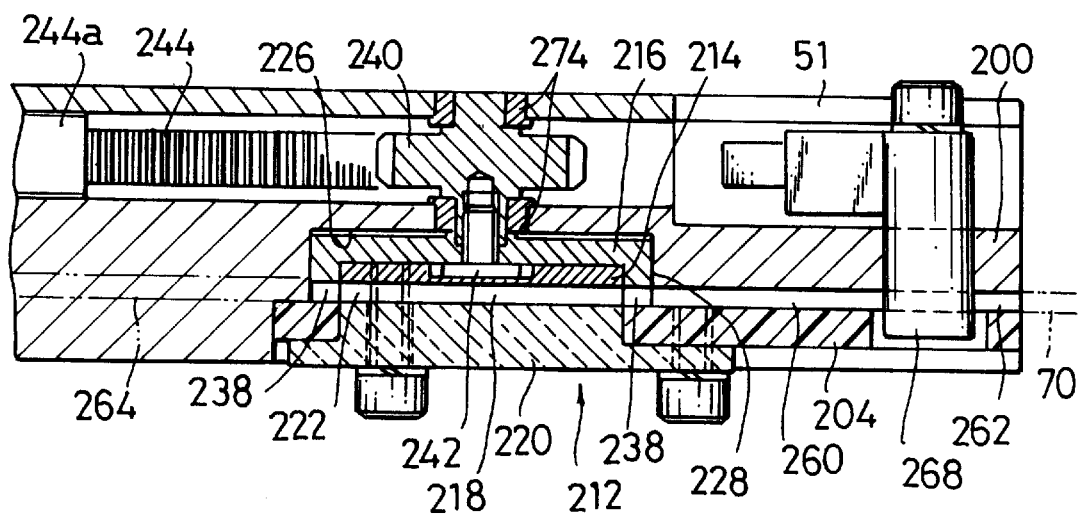
FIG. 22 is a sectional plan view of the direction shifting mechanism shown in FIG. 21.

The flat bottom-closed cylindrical rotary section 216, as shown in FIG. 22, is arranged in a circular recess 226 of the plate member 200 and includes a cylindrical portion 228 in contact with an outside of the stationary section 214. More specifically, the cylindrical portion 228 is in contact on an inner peripheral surface thereof with an outer peripheral surface of the stationary section 214, resulting in being slidably rotated along the outer peripheral surface of the stationary section 214. The cylindrical portion 228 is formed on an end surface thereof with a pair of slits 238 in a manner to be symmetric with respect to each other about a center of the rotary section 216. The slits 238 are arranged so as to diametrically extend through the cylindrical portion 228. The slits 238 are formed with a length substantially equal to a length of a long side of the rectangular chip 20, a width slightly larger than a thickness of the chip 20 and a depth slightly larger than a length of a short side of the chip 20. In the illustrated embodiment, the slits 238 each comprise a groove formed on a front end surface of the cylindrical portion 228. Thus, the slits 238 provide a passage communicating with the chip dropping passage 208 open at an upper portion of the circular recess 226, as shown in FIG. 24.

The grooved plate member 200 and support 51, as shown in FIG. 22, are mounted thereon with a pinion 240 through bearings 274. The flat bottom-closed cylindrical rotary section 216 is fixedly mounted on a front side of the pinion 240 by means of a screw 242. The support 51 is provided thereon with a rack 244 in a manner to be horizontally slidable, which is engaged with the pinion 240. Horizontal movement of the rack 244 leads to rotation of the pinion 240 within an angular range of ±90 degrees.

Figure 23:
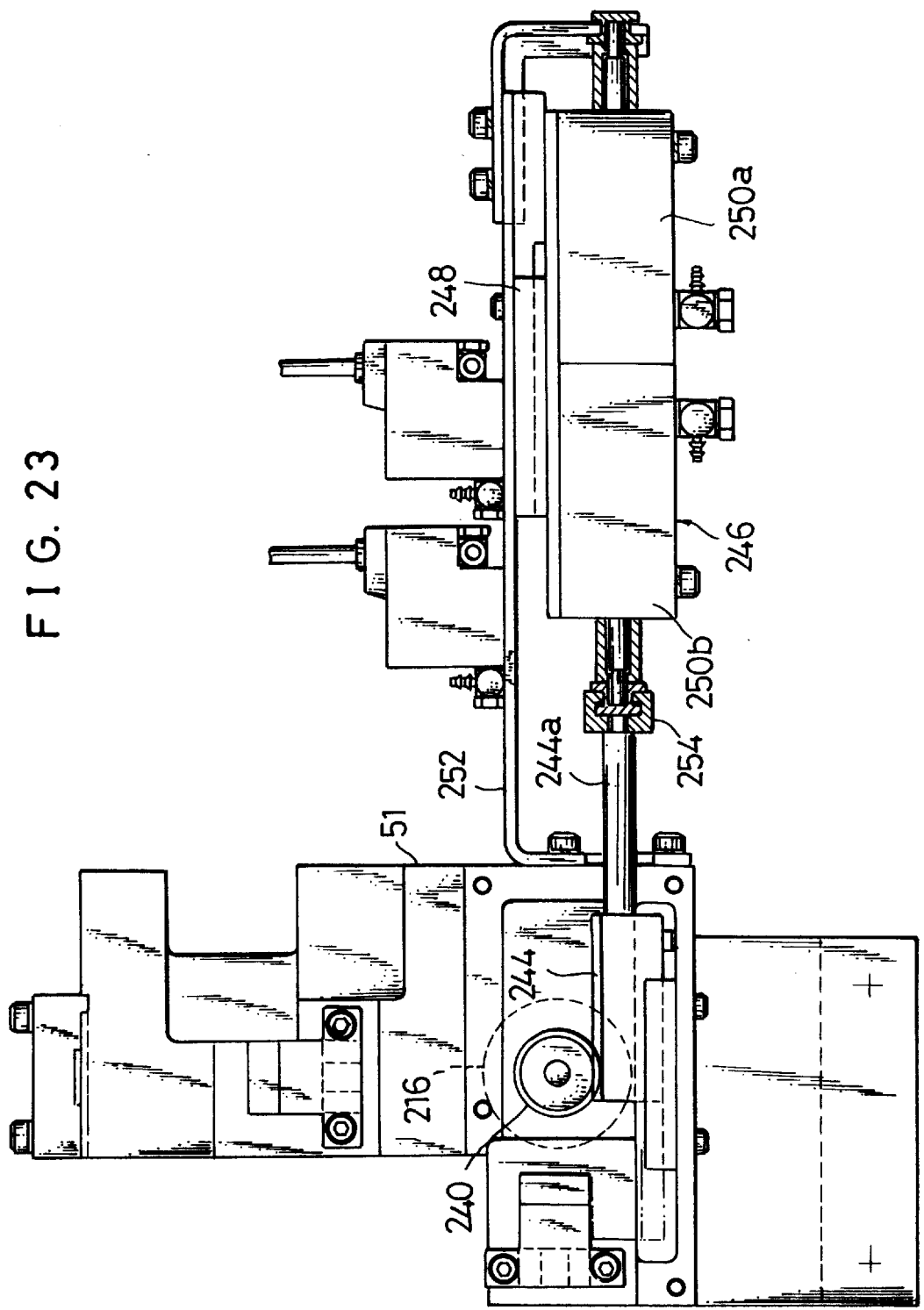
FIG. 23 is a rear view showing a cylinder mechanism for rotating the direction shifting mechanism of FIG. 22.

In FIG. 23, reference numeral 246 designates a cylinder mechanism for horizontally moving the rack 244 from a neutral position thereof, to thereby rotate the pinion 240 by ±90degrees. The cylinder mechanism 246 includes a slider 248 and air cylinders 250a and 250b mounted on the slider 248 while being kept facing each other in opposite directions. More particularly, the slider 248 is arranged so as to be horizontally slidable with respect to a horizontal portion of a cylinder mounting frame 252 fixed on the support 51 and the air cylinders 250a and 250b are each mounted at a body thereof on the slider 248. The air cylinder 250a has a piston rod fixed on an end of the cylinder mounting frame 252 and the air cylinder 250b has a piston rod connected through a joint 254 to an extension rod 244a formed integrally with the rack 244.

Figure 24:
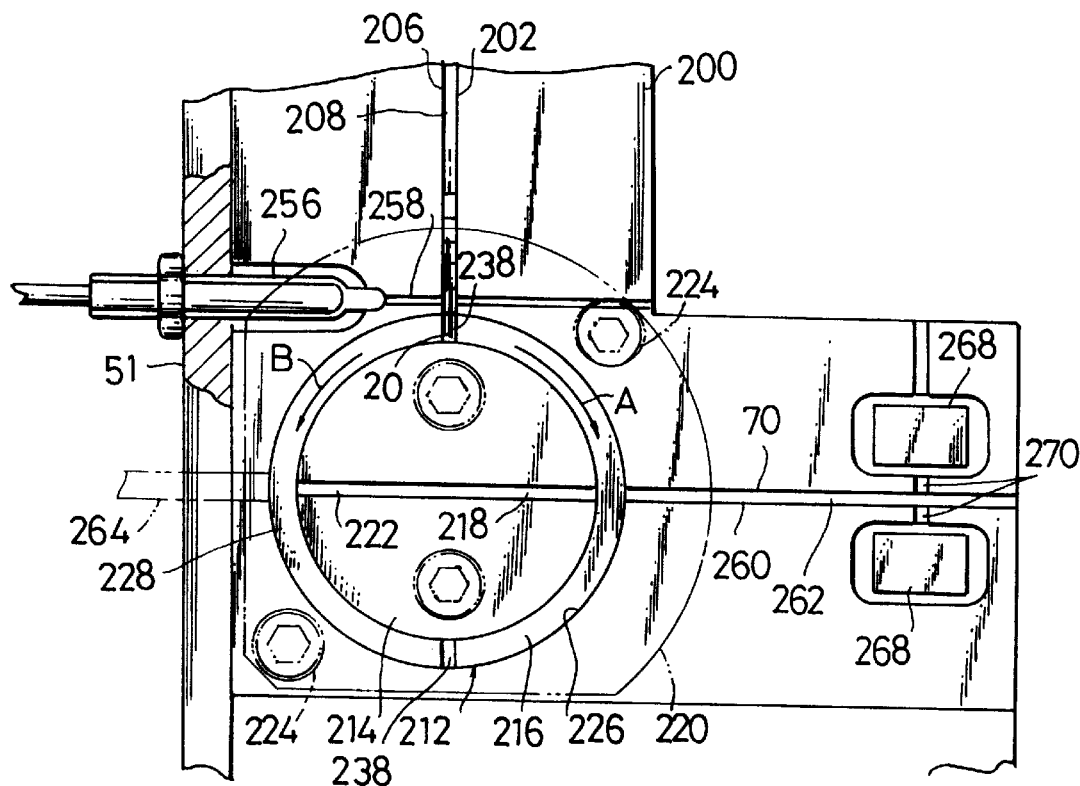
FIG. 24 is a front elevation view of the direction shifting mechanism shown in FIG. 21 which is kept at a neutral position.
Figure 25:
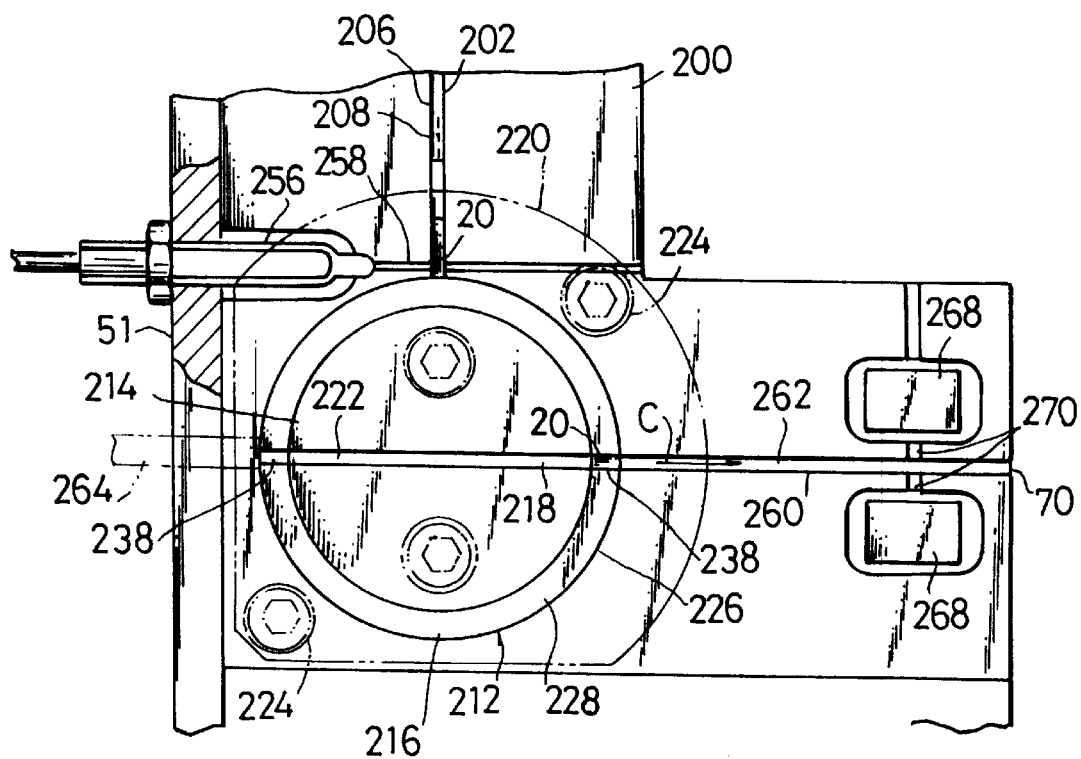
FIG. 25 is a front elevation view showing the direction shifting mechanism of FIG. 21 in which a flat bottom-closed cylindrical rotation section of the direction shifting mechanism is rotated by 90 degrees in a normal direction.
Figure 26:
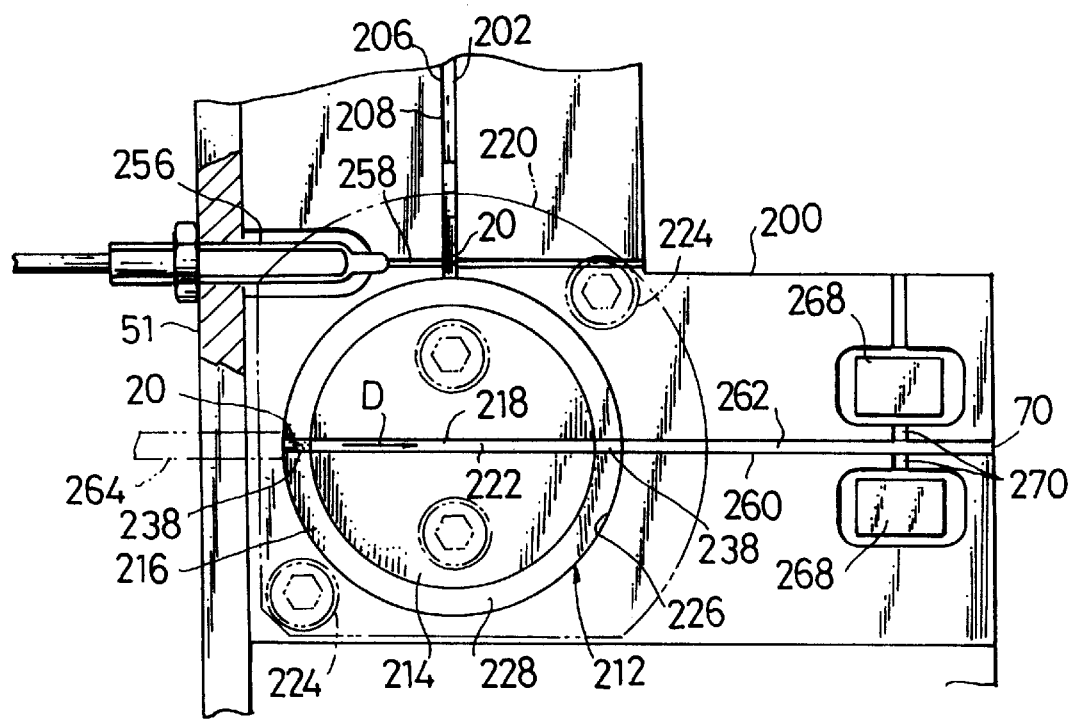
FIG. 26 is a front elevation view of the direction shifting mechanism of FIG. 21 in which the flat bottom-closed cylindrical rotation section is rotated by 90 degrees in a reverse direction.

In the cylinder mechanism 246 thus constructed, when both cylinders 250a and 250b are contracted as shown in FIG. 23, the flat bottom-closed cylindrical rotary section 216 is normally rotated by 90 degrees in a direction indicated at an arrow A in FIG. 24 from a position shown in FIG. 24, to thereby take such a position as shown in FIG. 25. FIG. 23 is viewed from a rear side of FIG. 20, so that rotation of the pinion 240 in a counterclockwise direction in FIG. 23 corresponds to that in a clockwise direction in FIGS. 20 and 24. When one of the air cylinders 250a and 250b is contracted and the other is extended, the rack 244 is at the neutral position, so that the flat bottom-closed cylindrical rotary section 216 takes such a position as shown in FIG. 24. When both air cylinders 250a and 250b are extended, the rotary section 216 is reversely rotated by 90 degrees in a direction indicated at an arrow B from a position shown in FIG. 24, to thereby take such a position as shown in FIG. 26. Thus, it will be noted that the pinion 240, rack 244 and cylinder mechanism 246 cooperate with each other to provide a rotation drive section for the flat bottom-closed cylindrical rotary section 216.

As shown in FIGS. 20, 21 and 24 to 26, the chip dropping passage 208 is provided at a lower end thereof with a chip surface detection sensor 256. The chip surface detection sensor 256 is fixed on the support 51 for detecting a surface of a rectangular chip 20 positioned just before the slits 238 or a lowermost rectangular chip 20 in the chip dropping passage 208. For this purpose, the grooved plate member 200 is formed with a light guide groove or hole 258 which permits light of the sensor 256 to be guided to the chip dropping passage 208. The sensor 256 may comprise a reflection type photosensor which is adapted to detect or discriminate brightness or lightness of a surface of a rectangular chip 20 opposite to the sensor 256. For example, when a rectangular chip 20 is a chip resistor, a front surface of the resistor on which a carbon resistance film is formed is black and a rear surface thereof to be mounted on a printed board is white; thus, the reflection type photosensor accomplishes discrimination between the front surface and the rear surface.

The grooved plate member 200 is formed at a lower portion thereof with a horizontally extending groove 260 of a rectangular shape in section, of which a front opening, as shown in FIG. 22, is covered with the cover plate 204 made of a transparent resin material as in the vertical groove 202 described above, resulting in providing a horizontal duct 262 for delivering rectangular chips 20 therethrough. The horizontal groove 260 is open on a right side of the circular recess 226 and has the same section as the horizontal groove 218 and slits 238, to thereby provide a chip passage in cooperation therewith. Reference numeral 264 designates an air path arranged opposite to the horizontal groove 260 with the stationary section 214 and cylindrical portion 228 being interposed therebetween. More specifically, the air path 264 is arranged on a left side of the circular recess 226. The air path 264 has a distal end formed on the grooved plate member 200 and an external connection port 266 fed with compressed air.

The horizontal groove 260 is provided in the middle thereof with a chip passage detection sensor 268. The chip passage detection sensor 268 comprises a photosensor. When it is constructed into a transmission type, it includes a light emitting section and a light receiving section with the horizontal groove 260 being interposed therebetween. For this purpose, a light guide groove or hole 270 is arranged so as to extend in a direction perpendicular to the horizontal groove 260, so that light emitted from the light emitting section is received by the light receiving section when any rectangular chip 20 is not at a portion of the horizontal groove 260 between both sections. When a rectangular chip 20 passes through the portion to intercept the light, the sensor 268 detects passage of the chip.

The remaining part of the illustrated embodiment may be constructed in substantially the same manner as the embodiment described above.

Now, the manner of operation of the chip feed apparatus of the illustrated embodiment thus constructed will be described hereinafter.

Figure 21:
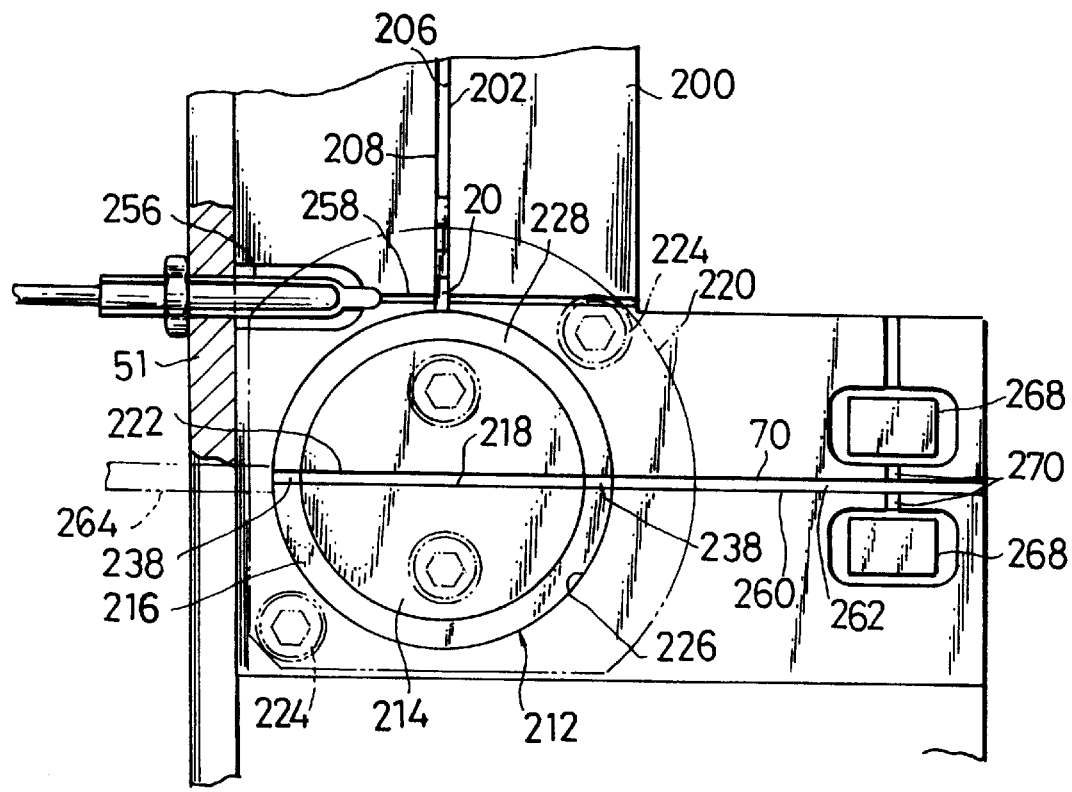
FIG. 21 is a front elevation view showing a direction shifting mechanism incorporated in the chip feed apparatus of FIG. 20.

First, the hopper 13 is charged therein with a number of bulk rectangular chips 20. Then, a switch 45 is turned on, to thereby be ready to drive the hopper elevating DC motor 42 and position the flat bottom-closed cylindrical rotary section 216 of the direction shifting mechanism 212 so as to align the horizontal stationary passage 222 and slits 238 with each other, as shown in FIG. 21. This prevents chips 20 dropping through the chip dropping passage 208 from dropping directly into the slits 238.

When the chip detection sensor 210 does not detect an end of an array of rectangular chips 20 aligned with each other in the chip dropping passage 208, the DC motor 42 is driven to cause a hopper base 12 and the hopper 13 to carry out vertical movement through a cam mechanism. This permits the chip separating and aligning pipe 55 to access to a funnel-like space of the hopper 13, so that the pipe 55 may slightly vertically move chips 20 in the funnel-like space. This results in chips 20 in the hopper 13 entering or dropping into the through-hole of the pipe 55 in turn while being separated from each other. Then, the chips 20 drop toward the lower end of the chip dropping passage 208; during which initially the lower opening of the chip dropping passage 208 is closed by the cylindrical portion 228 of the flat bottom-closed cylindrical rotary section 216, so that chips 20 are collected in the chip dropping passage 208 in turn while being aligned with each other. Driving of the DC motor 42 is continued until the chip detection sensor 210 detects an array of chips 20 vertically aligned in the passage 208 or an end of the array at the position where it is arranged. When the sensor 210 detects the array, operation of the DC motor 42 is interrupted to stop vertical movement of the hopper 13, so that feeding of rectangular chips 20 to the chip dropping passage 208 is stopped.

The direction shifting mechanism 212, immediately after operation of the apparatus is started, is adapted to start operation after the chip detection sensor 210 detects an array of chips 20 vertically aligned. The direction shifting mechanism 212 receives rectangular chips 20 dropping in order through the chip dropping passage 208 when it is at such a state as shown in FIG. 21 and the chip surface detection sensor 256 detects a surface of a rectangular chip 20 positioned at the lowermost end of the chip dropping passage 208 when it is thus received. Then, when the cylindrical portion 228 of the flat bottom-closed cylindrical rotary section 216 is returned to the neutral position to align the slits 238 of the cylindrical portion 228 with the chip dropping passage 208, to thereby permit both to communicate with each other, resulting in one rectangular chip 20 which has been subjected to surface detection by the sensor 256 being introduced into one of the slits 238.

When a detection signal generated by the chip surface detection sensor 256 indicates that a surface of the rectangular chip 20 opposite to the sensor 256 is a front surface of the chip, the cylinder mechanism 246 is actuated to rotate the flat bottom-closed cylindrical rotary section 216 by 90 degrees in a normal direction or a clockwise direction as indicated at an arrow A in FIG. 24, so that the one slit 238 in which the chip 20 is received is connected directly to the horizontal duct 262 of a horizontal chip feed path 70 as shown in FIG. 25. In FIG. 25, the upper surface of the chip 20 faces upwardly, thus, a rear surface of the chip to be mounted on a printed board faces downwardly. When the chip 20 takes such a posture as shown in FIG. 25, air is ejected from an opening of the air path 264 through the other slit 238 empty and the horizontal stationary passage 222 toward the rectangular chip 20 in the slit 238. Also, a chip outlet opening 100 defined at a chip pick-up position P on a distal end side of a straight chute 61 is kept closed by a shutter 73 in a manner similar to that described above with reference to FIG. 14, resulting in suction force due to a negative pressure through air suction holes 74 and 75 being applied to the chip, so that force in a direction indicated at an arrow C in FIG. 25 or in a direction toward the chip pick-up position P is applied to the chip 20. This causes the chip 20 to be transferred through the horizontal duct 262 and a horizontal duct 272 (FIG. 20) which cooperate with each other to provide the horizontal chip feed path 70, so that the chip 20 is abutted against the stopper 71, resulting in being stopped. This causes the foremost rectangular chip 20 to be stopped at the chip pick-up position P defined at a position of the chip outlet opening 100.

When the signal of the chip surface detection sensor 256 indicates that the surface of the rectangular chip 20 opposite to the sensor 256 is a rear surface of the chip, the cylinder mechanism 246 is actuated to rotate the flat bottom-closed cylindrical rotary section 216 by 90 degrees in a reverse direction or a counterclockwise direction as indicated at an arrow B in FIG. 24, so that the one slit 238 in which the chip 20 is received is connected to the horizontal stationary passage 222 of the stationary section 214 on a side opposite to the horizontal duct 262, as shown in FIG. 26. In FIG. 26 as well, the upper surface of the chip 20 faces upwardly, thus, the rear surface of the chip faces downwardly. When the chip 20 takes such a posture as shown in FIG. 26, air is ejected from the opening of the air path 264 toward the rectangular chip 20 in the slit 258. Also, the chip outlet opening 100 defined at the chip pick-up position P on the distal end side of the straight chute 61 is likewise kept tightly closed by the shutter 73, resulting in suction force due to a negative pressure through the air suction holes 74 and 75 being generated to form an air stream in a direction indicated at an arrow D in FIG. 26, so that force in the direction of the arrow D or in a direction toward the chip pick-up position P is applied to the chip 20. This causes the chip 20 to be transferred through the horizontal stationary passage 222 and the other slit 238, as well as through the horizontal duct 262 and horizontal duct 272 of the horizontal chip feed path 70, so that the chip 20 is abutted against the stopper 71, resulting in being stopped.

When the chip passage detection sensor 268 arranged in the middle of the horizontal duct 262 of the horizontal chip feed path 70 detects passage of one rectangular chip 20, the direction shifting mechanism 212 is returned to the neutral position shown in FIG. 24 to receive the next chip 20 which has been subjected to surface detection or discrimination. Then, the above-described operation is repeated.

The number of rectangular chips 20 in the horizontal chip feed path 70 is excessively increased to cause an end of an array of the chips aligned to continuously intercept light of the chip passage detection sensor 268, operation of the direction shifting mechanism 212 is interrupted.

Also, in such a state as shown in each of FIGS. 25 and 26, when the chip passage detection sensor 268 fails to detect passage of a rectangular chip 20, the operation is likewise interrupted because there is much possibility that any trouble such as clogging of the path or passage with chips occurs.

The remaining part of operation of the illustrated embodiment may be practiced in substantially the same manner as in the embodiment described above.

The illustrated embodiment exhibits a variety of significant advantages.

More particularly, the hopper 13 is vertically moved with respect to the chip separating and aligning pipe 55 to separate chips 20 from each other, and then the direction shifting mechanism 212 aligns them with each other based on a surface of the chips, followed by feeding of chips, resulting in minimizing damage to the chips and pollution thereof.

The illustrated embodiment is so constructed that the chip dropping passage 208 is vertically arranged with respect to the direction shifting mechanism 212 and the horizontal chip feed path 70 is horizontally arranged with respect to the direction shifting mechanism 212. Such construction permits taking-out of chips 20 from the hopper 13 to be positively carried out by gravity and delivery of chips to a chip mounting apparatus to be effectively attained by a combination of ejected air and a negative pressure.

Also, in the illustrated embodiment, the chip passage detections sensor 268 detects delivery of a chip 20 from the direction shifting mechanism 212 and then the direction shifting mechanism 212 receives the next chip therein. Thus, positive operation of the direction shifting mechanism 212 is ensured and any trouble such as clogging of the path or passage with chips or the like is rapidly detected.

The chip detection sensor 210 is arranged in the middle of the chip dropping passage 208, so that operation of the motor 42 is interrupted to stop vertical movement of the hopper 13 when the amount of chips 20 in the chip dropping passage 208 reaches a predetermined level or more. This prevents excessive stirring of chips 20 in the hopper 13, to thereby minimize damage to the chips.

In the illustrated embodiment, as shown in FIG. 22, the pinion 240, rack 244 and cylinder mechanism 246 cooperate with each other to provide the rotation drive section for rotating the flat bottom-closed cylindrical rotary section 216 of the direction shifting mechanism 212. Alternatively, the flat bottom-closed cylindrical rotary section 216 may be directly driven by a motor.

Figure 27:
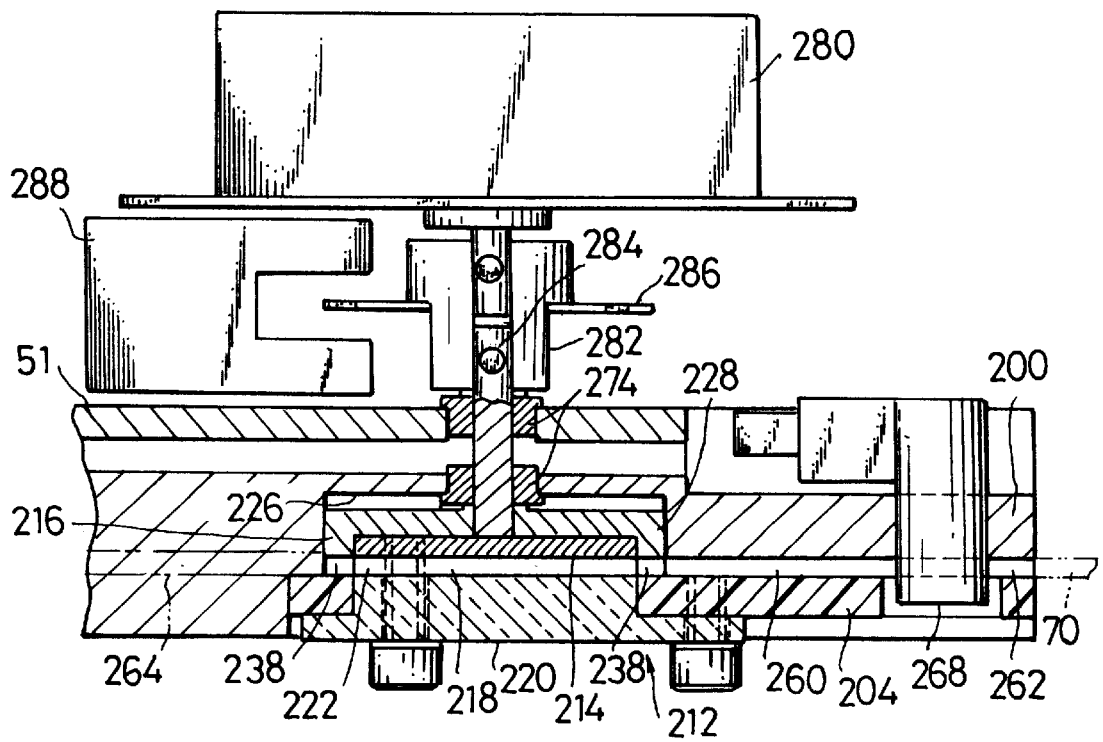
FIG. 27 is a sectional plan view showing a modification of a rotation drive section of the direction shifting mechanism of FIG. 21.

Referring now to FIG. 27, a modification of the rotation drive section is illustrated. In FIG. 27, reference numeral 280 designates a pulse motor, of which a revolving shaft is directly connected through a joint 282 to an extension shaft 284 of the flat bottom-closed cylindrical rotary section 216 of the direction shifting mechanism 212. The joint 282 has a rotation detecting plate 286 fixed thereon and a rotation detecting sensor 288 is provided for detecting rotation of the rotation detecting plate 286. The pulse motor 280 and rotation detecting sensor 288 are fixed on the support 51 by means of fitments (not shown). The rotation detecting sensor 288 comprises a transmission type photosensor and functions to detect an origin of the pulse motor 280. The rotation detecting plate 286 is provided with one origin detection slit or hole. The pulse motor 280 is subjected to rotation control by means of a pulse signal after detection of the origin. Such construction permits the cylindrical portion 228 of the flat bottom-closed cylindrical rotary section 216 to be rotated by 90 degrees in a normal direction or a clockwise direction from the neutral position of FIG. 24 as shown in FIG. 25 or by 90 degrees in a reverse direction as shown in FIG. 26.

The rotation drive section for the flat bottom-closed cylindrical rotary section of the direction shifting mechanism may be constructed in any suitable manner other than the above-described manner so long as it permits the rotary section to be rotated by an angle of ±90 degrees.

Further, in the illustrated embodiment, chip surface detection is carried out by means of the chip surface detection sensor 256. Alternatively, a polarity detecting sensor may be used which includes a probe adapted to be brought directly into contact with an electrode of a chip to detect electrical characteristics of the chip. This permits a chip having a polarity to be subjected to polarity detection, so that normal or reverse rotation of the direction shifting mechanism is controlled in response to results of the detection, resulting in delivering chips to the horizontal chip feed path while aligning the chips with each other based on a polarity thereof.

As can be seen from the foregoing, the chip feed apparatus of the present invention is so constructed that the chip feed casing which is separated from the hopper is detachably or replaceably mounted on the hopper, to thereby feed chips from the chip receiving space of the chip feed casing to the chip storage space of the hopper. Thus, the chip feed casing is provided independent from the hopper while being detachable with respect to the hopper, resulting in being manufactured at a reduced cost and used as a container for storage and transportation in a distribution channel or system as well.

Also, the chip feed casing is formed with the chip outlet on one side surface thereof and the hopper is formed with the chip inlet on one side surface thereof, so that the chip feed casing and hopper are connected to each other while keeping the chip outlet and chip inlet aligned with each other. Such construction effectively prevents a weight of chips in the chip feed casing from being applied directly to the lower portion of the chip storage space of the hopper irrespective of the amount of chips in the casing, to thereby permit the chip feed casing to be significantly large-sized.

In the present invention, a height of chips in the chip storage space of the hopper or the amount of chips stored in the chip storage space is regulated by a vertical position of lower one of the upper edge of the chip outlet of the chip feed casing and that of the chip inlet of the hopper, so that the amount of chips in the chip storage space of the hopper may be kept at a substantially constant level. This prevents a weight of chips applied to the lower portion of the chip storage space from being excessively increased, to thereby ensure positive and smooth separation and feeding of chips.

In addition, the chip separating member accesses to the chip storage space of the hopper, to thereby permit chips to be safely and smoothly dropped from the storage space via the through-hole of the member. Thus, the present invention satisfactorily accomplishes alignment and feeding of chips while preventing clogging of the chip storage space with chips, damage to chips and pollution of chips.

Further, the present invention satisfactory accomplishes feeding of chips of which a surface or a polarity is required to be identified or discriminated.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A chip feed apparatus comprising:
   a chip feed casing provided therein with a chip receiving space for receiving chips therein and having a chip outlet formed on a vertical side surface thereof so as to be open at a lowermost end of said chip receiving space or below said lowermost end;
   a hopper provided therein with a chip storage space and having a chip inlet formed on a vertical side surface thereof in a lower portion thereof so as to communicate with said chip storage space;
   said hopper being formed at a bottom thereof with a hole communicating with said chip storage space;
   a chip separating member inserted into said hole of said hopper and formed with a passage of a sectional configuration which permits one chip to pass through said passage; and
   an alignment chute provided with a chip feed path of which one end is connected to said passage of said chip separating member and the other end is defined at a chip pick-up position;
   said hopper and said chip feed casing being connected at said vertical side surfaces, to keen said chip outlet and said chip inlet aligned with each other, while enabling vertical movement of said hopper relative to said chip separating member, whereby a height of chips stored in said chip storage space due to feeding of chips from said chip receiving space to said chip storage space is regulated by a lower one of an upper edge of said chip outlet and an upper edge of said chip inlet.

2. A chip feed apparatus as defined in claim 1, wherein said chip feed casing is separate from said hopper and detachably connected to said hopper;
   said chip feed casing includes a casing shutter for selectively closing said chip outlet; and
   said chip feed casing is prevented from being detached from said hopper when said casing shutter keeps said chip outlet open.

3. A chip feed apparatus as defined in claim 2, further comprising a holding means for holding said chip feed casing on said hopper;
   said holding means including holes formed on said one side surface of said chip feed casing and holding pawls projectedly formed on said one side surface of said hopper so as to be engaged with said holes;
   said holes and pawls being prevented from being released from engagement therebetween when said casing shutter keeps said chip outlet open.

4. A chip feed apparatus as defined in claim 1, wherein said chip feed casing and hopper are commonly provided with a first positioning means for positioning a bottom surface of said chip feed casing in a longitudinal direction thereof and a second positioning means for positioning said bottom surface of said chip feed casing in a lateral direction thereof.

5. A chip feed apparatus as defined in claim 2, wherein said chip feed casing and hopper are commonly provided with a first positioning means for positioning a bottom surface of said chip feed casing in a longitudinal direction thereof and a second positioning means for positioning said bottom surface of said chip feed casing in a lateral direction thereof.

6. A chip feed apparatus as defined in claim 3, wherein said chip feed casing and hopper are commonly provided with a first positioning means for positioning a bottom surface of said chip feed casing in a longitudinal direction thereof and a second positioning means for positioning said bottom surface of said chip feed casing in a lateral direction thereof.

7. A chip feed apparatus as defined in claim 1, further comprising a sensor arranged in said chip feed path for detecting one of a surface of chips and a polarity thereof; and
   a direction shifting mechanism arranged in said chip feed path for aligning chips with each other in said chip feed path in response to results of detection by said sensor so that the chips take the same posture.

8. A chip feed apparatus as defined in claim 7, wherein said chip feed path includes a vertical passage connected to said passage of said chip separating member and a horizontal chip feed path;
   said sensor is arranged at a portion of said vertical passage of said chip feed path; and
   said direction shifting mechanism includes a stationary section provided with a horizontal stationary passage, a rotary section fitted on said stationary section while being kept in contact with an outside of said stationary section and a rotation drive section for driving said rotary section;
   said rotary section being provided with a pair of slits in a diametrically symmetrical manner, said slits each being formed with a size sufficient to permit one chip to be received in said slit;
   said horizontal chip feed path communicating with said slits when said horizontal stationary passage of said stationary section is aligned with said slits;
   said slits of said rotary section receiving chips dropping through said vertical passage one by one therein;
   said rotary section being rotated in a direction controlled in response to results of detection by said sensor, resulting in said slits communicating with said horizontal chip feed path.

9. A chip feed apparatus as defined in claim 8, further comprising an air path arranged opposite to said horizontal chip feed path with said stationary section and rotary section being interposed therebetween and communicating with one of said slits when said horizontal stationary passage and said slits communicate with each other;

said air path guiding ejected air therethrough which acts to forcibly feed a chip received in said slit to said horizontal chip feed path.

10. A chip feed apparatus as defined in claim 8, wherein said horizontal chip feed path is provided at a distal portion thereof positionally corresponding to said chip pick-up position with a chip outlet opening which is selectively closed by a shutter, further comprising:

an air suction path arranged so as to communicate with said horizontal chip feed path, so that air suction from said horizontal chip feed path is carried out when said shutter is operated to close said chip outlet opening and said air suction path is interrupted when said shutter is operated to open said chip outlet opening.

11. A chip feed apparatus as defined in claim 9, wherein said horizontal chip feed path is provided at a distal portion thereof positionally corresponding to said chip pick-up position with a chip outlet opening which is selectively closed by a shutter, further comprising:

an air suction path arranged so as to communicate with said horizontal chip feed path, so that air suction from said horizontal chip feed path is carried out when said shutter is operated to close said chip outlet opening and said air suction path is interrupted when said shutter is operated to open said chip outlet opening.

12. A chip feed apparatus as defined in claim 8, further comprising a chip passage detection sensor arranged in the middle of said horizontal chip feed path, so that when said chip passage detection sensor detects discharge of a chip from said direction shifting mechanism, the next chip is received in said direction shifting mechanism.

13. A chip feed apparatus as defined in claim 9, further comprising a chip passage detection sensor arranged in the middle of said horizontal chip feed path, so that when said chip passage detection sensor detects discharge of a chip from said direction shifting mechanism, the next chip is received in said direction shifting mechanism.

14. A chip feed apparatus as defined in claim 10, further comprising a chip passage detection sensor arranged in the middle of said horizontal chip feed path, so that when said chip passage detection sensor detects discharge of a chip from said direction shifting mechanism, the next chip is received in said direction shifting mechanism.

15. A chip feed apparatus as defined in claim 2, wherein said hopper is formed at an upper portion thereof with an opening communicating with said chip storage space and includes a lid to open and shut said opening, whereby replenishment of chips to said chip storage space is carried out through said opening.

16. A chip feed apparatus as defined in claim 2, wherein said hopper includes a funnel-like member made of metal which is fixedly arranged on a bottom of said chip storage space.

17. A chip feed apparatus comprising:

a chip feed casing provided therein with a chip receiving space for receiving chips therein and having a chip outlet formed on one side surface thereof so as to be open at a lowermost end of said chip receiving space or below said lowermost end;

a hopper provided therein with a chip storage space and having a chip inlet formed on one side surface thereof so as to communicate with said chip storage space;

said one side surfaces of said chip feed casing and said one side surface of said hopper being connected to each other while keeping said chip outlet and chip inlet aligned with each other, to thereby connect said chip feed casing and hopper to each other while enabling vertical movement of said hopper;

said hopper being formed with a hole communicating with said chip storage space;

a chip separating member inserted into said hole of said hopper and formed with a passage of a sectional configuration which permits one chip to pass through said passage;

an alignment chute provided with a chip feed path of which one end is connected to said passage of said chip separating member and the other end is defined at a chip pick-up position, said chip feed path including a vertical passage connected to said passage of said chip separating member and a horizontal clip feed path;

a sensor arranged at a portion of said vertical passage of said chip feed path for detecting one of a surface of chips and a polarity thereof;

a direction shifting mechanism arranged in said chip feed path in response to results of detection by said sensor so that the chips can take the same posture, said direction shifting mechanism including a stationary section provided with a horizontal stationary passage, a rotary section fitted on said stationary section while being kept in contact with an outside of said stationary section and a rotation drive section for driving said rotary section;

said rotary section being provided with a pair of slits in a diametrically symmetrical manner, said slits each being formed with a size sufficient to permit one chip to be received in said slit;

said horizontal chip feed path communicating with said slits when said horizontal stationary passage of said stationary section is aligned with said slits;

said slits of said rotary section receiving chips dropping through said vertical passage one by one therein;

said rotary section being rotated in a direction controlled in response to results of detection by said sensor, resulting in said slits communicating with said horizontal chip feed path;

a height of chips stored in said chip storage space due to feeding of chips from said chip receiving space to said chip storage space being regulated by a lower one of an upper edge of said chip outlet and an upper edge of said chip inlet.

18. A chip feed apparatus as defined in claim 17, further comprising an air path arranged opposite to said horizontal chip feed path with said stationary section and rotary section being interposed therebetween and communicating with one of said slits when said horizontal stationary passage and said slits communicate with each other;

said air path guiding ejected air therebetween which acts to forcibly feed a chip received in said slit to said horizontal chip feed path.

19. A chip feed apparatus as defined in claim 17, wherein said horizontal chip feed path is provided at a distal portion thereof positionally corresponding to said chip pick-up position with a chip outlet opening which is selectively closed by a shutter, further comprising:

an air suction path arranged so as to communicate with said horizontal chip feed path, so that air suction from said horizontal chip feed path is carried out when said shutter is operated to close said chip outlet opening and said air suction path is interrupted when said shutter is operated to open said chip outlet opening.

20. A chip feed apparatus as defined in claim 18, wherein said horizontal chip feed path is provided at a distal portion thereof positionally corresponding to said chip pick-up position with a chip outlet opening which is selectively closed by a shutter, further comprising:

an air suction path arranged so as to communicate with said horizontal chip feed path, so that air suction from said horizontal chip feed path is carried out when said shutter is operated to close said chip outlet opening and said air suction path is interrupted when said shutter is operated to open said chip outlet opening.

21. A chip feed apparatus as defined in claim 17, further comprising a chip passage detection sensor arranged in the middle of said horizontal chip feed path, so that when said chip passage detection sensor detects discharge of a chip from said direction shifting mechanism, the next chip is received in said direction shifting mechanism.

22. A chip feed apparatus as defined in claim 18, further comprising a chip passage detection sensor arranged in the middle of said horizontal chip feed path, so that when said chip passage detection sensor detects discharge of a chip from said direction shifting mechanism, the next chip is received in said direction shifting mechanism.

23. A chip feed apparatus as defined in claim 19, further comprising a chip passage detection sensor arranged in the middle of said horizontal chip feed path, so that when said chip passage detection sensor detects discharge of a chip from said direction shifting mechanism, the next chip is received in said direction shifting mechanism.

\* \* \* \* \*

UNITED STATES PATENT AND TRADEMARK OFFICE
CERTIFICATE OF CORRECTION

PATENT NO. : 5,853,079
DATED : December 29, 1998
INVENTOR(S) : Ito et al.

It is certified that error appears in the above-identified patent and that said Letters Patent is hereby corrected as shown below:

Title page, item [75], after "Yuri-gun" insert --Akita--.
In the Abstract, line 3, "and" should read --as--.
Column 2, line 3, delete "the".
Column 7, line 25, "an" should read --a--.
Column 10, line 7, "replenish" should read --replenishing--.
Column 14, line 63, delete "the" (second occurrence).
Column 17, line 33, after "in" insert --it--.
Column 18, line 6, "increase" should read --increased--.
Column 18, line 31, "When" should read --when--.
Column 19, line 29, after "resulting" insert --in--.
Column 24, line 50, after "in" insert --it--.
Column 25, line 14, after "in" insert --it--.
Column 27, line 52, "keen" should read --keep--.
Column 29, line 66, "surfaces" should read --surface--.
Column 30, line 16, "clip" should read --chip--.

Signed and Sealed this

Twenty-ninth Day of June, 1999

*Attest:*

Q. TODD DICKINSON

*Attesting Officer*   Acting Commissioner of Patents and Trademarks